(12) United States Patent
Camm et al.

(10) Patent No.: US 8,005,351 B2
(45) Date of Patent: Aug. 23, 2011

(54) IRRADIANCE PULSE HEAT-TREATING METHODS AND APPARATUS

(75) Inventors: David Malcolm Camm, Vancouver (CA); Steve McCoy, Burnaby (CA); Greg Stuart, Burnaby (CA)

(73) Assignee: Mattson Technology Canada, Inc., Vancouver, BC (CA)

( * ) Notice: Subject to any disclaimer, the term of this patent is extended or adjusted under 35 U.S.C. 154(b) by 723 days.

(21) Appl. No.: 12/053,102

(22) Filed: Mar. 21, 2008

(65) Prior Publication Data

US 2008/0273867 A1     Nov. 6, 2008

Related U.S. Application Data

(60) Provisional application No. 60/924,115, filed on May 1, 2007.

(51) Int. Cl.
*A21B 2/00* (2006.01)
*A21B 1/00* (2006.01)
*C23C 16/00* (2006.01)

(52) U.S. Cl. ............... 392/416; 219/411; 118/725

(58) Field of Classification Search .......... 392/407–440; 219/411, 405, 390; 118/725, 722, 723
See application file for complete search history.

(56) References Cited

U.S. PATENT DOCUMENTS

| | | |
|---|---|---|
| 2,794,938 A | 6/1957 | Moerkens |
| 3,963,945 A | 6/1976 | Colyn |
| 4,255,046 A | 3/1981 | Corona |
| 4,539,431 A | 9/1985 | Moddel et al. |
| 4,698,486 A | 10/1987 | Sheets |
| 4,789,992 A | 12/1988 | Wickersheim et al. |
| 4,881,013 A | 11/1989 | Kataoka et al. |
| 5,001,327 A * | 3/1991 | Hirasawa et al. ............ 219/390 |
| 5,188,458 A | 2/1993 | Thompson et al. ........... 374/121 |
| 5,343,012 A * | 8/1994 | Hardy et al. ................. 118/725 |
| 5,430,271 A * | 7/1995 | Orgami et al. ............... 219/388 |

(Continued)

FOREIGN PATENT DOCUMENTS

JP            60-258928          12/1985

(Continued)

OTHER PUBLICATIONS

Xu. et al. "Measurement of Solid-Liquid Interface Temperature During Pulsed Excimer Laser Melting of Polycrystalline Silicon Films," *Applied Physical Letters*, vol. 65, No. 14, pp. 1745-1747, Oct. 3, 1994.

(Continued)

*Primary Examiner* — Daniel Robinson
(74) *Attorney, Agent, or Firm* — Knobbe, Martens, Olson & Bear, LLP

(57) ABSTRACT

A method of heat-treating a workpiece includes generating an initial heating portion and a subsequent sustaining portion of an irradiance pulse incident on a target surface area of the workpiece. A combined duration of the initial heating portion and the subsequent sustaining portion is less than a thermal conduction time of the workpiece. The initial heating portion heats the target surface area to a desired temperature and the subsequent sustaining portion maintains the target surface area within a desired range from the desired temperature. Another method includes generating such an initial heating portion and subsequent sustaining portion of an irradiance pulse, monitoring at least one parameter indicative of a presently completed amount of a desired thermal process during the irradiance pulse, and modifying the irradiance pulse in response to deviation of the at least one parameter from an expected value.

17 Claims, 11 Drawing Sheets

U.S. PATENT DOCUMENTS

| | | | |
|---|---|---|---|
| 5,497,051 A | 3/1996 | Langhans et al. | 315/200 |
| 5,561,735 A | 10/1996 | Camm | |
| 5,660,472 A | 8/1997 | Peuse et al. | |
| 5,747,944 A | 5/1998 | Harada | |
| 5,755,511 A | 5/1998 | Peuse et al. | |
| 5,823,681 A | 10/1998 | Cabib et al. | |
| 5,841,110 A | 11/1998 | Nenyei et al. | 219/497 |
| 5,848,842 A | 12/1998 | Peuse et al. | |
| 6,056,434 A | 5/2000 | Champetier | |
| 6,154,241 A | 11/2000 | Matsukawa et al. | 347/175 |
| 6,179,466 B1 | 1/2001 | Peuse et al. | |
| 6,303,411 B1 | 10/2001 | Camm et al. | 438/149 |
| 6,350,326 B1 | 2/2002 | McCay et al. | 148/503 |
| 6,366,308 B1 | 4/2002 | Hawryluk et al. | 347/256 |
| 6,391,690 B2 | 5/2002 | Miyasaka | |
| 6,534,752 B2 | 3/2003 | Camm et al. | 219/497 |
| 6,594,446 B2 | 7/2003 | Camm et al. | 392/446 |
| 6,621,199 B1 | 9/2003 | Parfeniuk et al. | 313/231.51 |
| 6,630,991 B2 | 10/2003 | Kitamura et al. | |
| 6,660,572 B2 | 12/2003 | Miyasaka | |
| 6,671,235 B1 | 12/2003 | Hawryluk et al. | 369/14 |
| 6,716,748 B2 * | 4/2004 | Kersch | 438/660 |
| 6,798,142 B2 | 9/2004 | Eguchi | 315/115 |
| 6,849,831 B2 | 2/2005 | Timans et al. | 219/390 |
| 6,855,916 B1 | 2/2005 | Matthews et al. | 219/390 |
| 6,888,319 B2 | 5/2005 | Inochkin et al. | |
| 6,897,130 B2 | 5/2005 | Miyauchi et al. | 438/502 |
| 6,941,063 B2 | 9/2005 | Camm et al. | 392/416 |
| 6,963,692 B2 | 11/2005 | Camm et al. | 392/416 |
| 6,970,644 B2 | 11/2005 | Koren et al. | 392/416 |
| 7,001,829 B1 | 2/2006 | Yamazaki | |
| 7,184,657 B1 | 2/2007 | Camm et al. | 392/418 |
| 7,186,981 B2 | 3/2007 | Shepard et al. | |
| 7,223,660 B2 | 5/2007 | Hwang | |
| 7,269,343 B2 * | 9/2007 | Koren et al. | 392/416 |
| 7,358,200 B2 * | 4/2008 | Yoo | 438/795 |
| 7,371,998 B2 * | 5/2008 | Harris et al. | 219/390 |
| 2002/0113060 A1 | 8/2002 | Sandhu | |
| 2004/0178553 A1 | 9/2004 | Camm et al. | 269/55 |
| 2004/0263090 A1 | 12/2004 | Erlbacher et al. | 315/241 |
| 2005/0018196 A1 | 1/2005 | Kusuda | 356/448 |
| 2005/0018748 A1 | 1/2005 | Ringermacher et al. | |
| 2005/0062388 A1 | 3/2005 | Camm et al. | 313/231.71 |
| 2005/0063448 A1 | 3/2005 | Kusuda | 374/1 |
| 2005/0063453 A1 | 3/2005 | Camm et al. | 374/161 |
| 2005/0133167 A1 | 6/2005 | Camm et al. | 156/345.51 |
| 2005/0179354 A1 | 8/2005 | Camm et al. | 313/231.51 |
| 2006/0096677 A1 | 5/2006 | Camm et al. | 148/565 |
| 2006/0201927 A1 | 9/2006 | Gat et al. | 219/390 |
| 2007/0052373 A1 | 3/2007 | Hui et al. | |
| 2007/0069161 A1 | 3/2007 | Camm et al. | 250/504 |
| 2009/0067823 A1 | 3/2009 | Kusuda | 392/418 |
| 2009/0103906 A1 | 4/2009 | Kusuda | 392/418 |
| 2009/0166351 A1 | 7/2009 | Yokomori | 219/492 |
| 2009/0263112 A1 | 10/2009 | Kiyama et al. | 392/418 |
| 2009/0285568 A1 | 11/2009 | Kiyama et al. | 392/418 |
| 2010/0111513 A1 | 5/2010 | Nishihara et al. | 392/418 |

FOREIGN PATENT DOCUMENTS

| | | |
|---|---|---|
| JP | 62-015826 | 1/1987 |
| JP | 62-112322 | 5/1987 |
| JP | 2-294027 | 12/1990 |
| JP | 03-221821 | 9/1991 |
| JP | 6-4002 | 1/1994 |
| JP | 6-14791 | 5/1994 |
| JP | 07-201765 | 8/1995 |
| JP | 08-255800 | 10/1996 |
| JP | 10-504-936 | 5/1998 |
| JP | 2000-003875 | 1/2000 |
| JP | 2001-304971 | 10/2001 |
| JP | 03-007632 | 1/2003 |
| JP | 2003-7633 | 1/2003 |
| WO | WO 97/22142 | 6/1997 |
| WO | WO 03/060447 | 7/2003 |
| WO | WO 2004/057650 | 7/2004 |
| WO | WO 2005/029014 | 3/2005 |

OTHER PUBLICATIONS

Barak, M., "Optimal Design of Pulse Forming Networks and Flash Lamps for Thermal Flash Process", pp. 79-88, 12th IEEE International Conference on Advanced Thermal Processing of Semiconductors—RTP 2004.

Correra, L., et al., "Incoherent-Light-Flash Annealing of Phosphorus-Implanted Silicon", Appl. Phys. Lett. vol. 37, No. 1, pp. 55-57, Jul. 1, 1980.

England, J.M.C., et al., "Time-Resolved Reflectivity Measurements of Temperature Distribution During Swept-Line Electron-Beam Heating of Silicon", J. App. Phys. vol. 70, No. 1, pp. 389-397, Jul. 1, 1991.

Gold, R.B., et al., "Calculation of Solid-Phase Reaction Rates Induced by a Scanning cw Laser", J. Appl. Phys. vol. 51, No. 2, pp. 1256-1258, Feb. 1990.

Liau, Z. L., et al., "Laser Annealing for Solid-Phase Thin-Film Reactions", Appl. Phys. Lett., vol. 34, No. 3, pp. 221-223, Feb. 1, 1979.

Matsumoto, S., et al., "High-Temperature Scanning cw Laser-Induced Diffusion of Arsenic and Phosphorus in Silicon", Appl. Phys. Lett., vol. 37, No. 9, pp. 821-824, Nov. 1, 1980.

Onizawa, T., et al. "A Proposal of New Concept Milli-Second Annealing: Flexibly-Shaped-Pulse Flash Lamp Annealing (FSP-FLA) for Fabrication of Ultra Shallow Junction with Improvement of Metal gate High-k CMOS Performance", Semiconductor Leading Edge Technologies, Jan. 4-8, 2008, VLSI Conference.

Wouters, D. J., et al., "A Comparison of Different Techniques for the Rapid Thermal Annealing of ION Implants in Silicon", Material Resources Society Symposium Proc. vol. 100, pp. 731-736.

Combined International Search Report and Written Opinion for commonly owned PCT application No. PCT/CA2008/000546.

* cited by examiner

IRRADIANCE PULSE HEAT-TREATING METHODS AND APPARATUS

CROSS-REFERENCE TO RELATED APPLICATIONS

This application claims the benefit of priority from U.S. provisional application Ser. No. 60/924,115 filed May 1, 2007, which is hereby incorporated herein by reference.

FIELD OF THE INVENTION

The present invention relates to methods and systems for heat-treating a workpiece, such as a semiconductor wafer, for example.

BACKGROUND OF THE INVENTION

Numerous applications involve heat-treating a workpiece. For example, in the manufacture of semiconductor chips such as microprocessors and other computer chips, a semiconductor wafer such as a silicon wafer is subjected to an ion implantation process, which introduces impurity atoms or dopants into a surface region of a device side of the wafer. The ion implantation process damages the crystal lattice structure of the surface region of the wafer, and leaves the implanted dopant atoms in interstitial sites where they are electrically inactive. In order to move the dopant atoms into substitutional sites in the lattice to render them electrically active, and to repair the damage to the crystal lattice structure that occurs during ion implantation, it is necessary to anneal the surface region of the device side of the wafer by heating it to a high temperature.

However, the high temperatures required to anneal the device side also tend to produce undesirable effects using existing technologies. For example, diffusion of the dopant atoms deeper into the silicon wafer tends to occur at much higher rates at high temperatures, with most of the diffusion occurring within close proximity to the high annealing temperature required to activate the dopants. Decades ago, diffusion was not as significant a barrier, and the relatively large and deep device sizes prevailing at those times could be manufactured by simply heating the entire wafer isothermally to an annealing temperature and then holding it at the annealing temperature for a relatively long time, such as minutes or even hours, for example.

However, in view of steadily increasing demand for greater performance and smaller device sizes, it is now necessary to produce increasingly shallow and abruptly defined junctions. As a result, diffusion depths that would have been considered negligible in the past or are even tolerable today will no longer be tolerable in the next few years or thereafter.

In light of the above difficulties, commonly owned U.S. Pat. Nos. 6,594,446, 6,941,063 and 6,963,692 (which are hereby incorporated herein by reference) disclose various methods of annealing a semiconductor wafer, such as a flash-assisted rapid thermal processing (fRTP™) cycle, for example. An example of an fRTP™ cycle may involve pre-heating the entire wafer to an intermediate temperature at a ramp rate slower than the thermal conduction rate through the wafer, then heating the device side of the wafer at a rate much faster than the thermal conduction rate, which may be achieved by exposing the device side to an irradiance flash. As an illustrative example, the wafer may be pre-heated to an intermediate temperature such as 600° C. for example, by irradiating the substrate side with an arc lamp to heat the entire wafer at a rate such as 150° C. per second, for example. The device side may then be exposed to a high-intensity flash from a flash lamp, such as a one-millisecond flash, to heat only the device side to an annealing temperature such as 1300° C., for example. Due to the rapid heating rate of the device side during the flash (in excess of $10^{5}$° C./s), the bulk of the wafer remains at the intermediate temperature, and acts as a heat sink to then cool the device side following the flash. Such a process may achieve the desired annealing temperature while at the same time advantageously minimizing dwell time above the intermediate temperature, thereby controlling dopant diffusion. Adjusting the intermediate temperature can vary the amount of diffusion, while changing the peak temperature can control activation, for example.

Commonly owned U.S. Patent Application Publication Nos. US 2005/0063453, US 2006/0096677 and US 2007/0069161 (which are hereby incorporated herein by reference) disclose various improvements to such processes, including (among other things) real-time temperature measurement of the device side during an initial portion of the irradiance flash, and real-time feedback control of the remaining portion of the irradiance flash based on the measured temperatures.

SUMMARY OF THE INVENTION

The present inventors have conceived that an improved process that achieves greater amounts of desired high-temperature process reactions, such as dopant activation for example, will produce improved products. At the same time, however, the desire to increase the desired high-temperature process reactions must be balanced against the desire to minimize or control other less desirable or undesirable processes, such as dopant diffusion, in order to achieve increasingly smaller devices with increasingly shallow and abruptly defined junctions.

Generally, the result of such a high-temperature process, i.e. the amount of desired reactions that have occurred, will depend upon both temperature and time, so that a shorter time at a higher temperature may produce the same result as a longer time at a lower temperature. Thus, in general, it is possible to increase the amount of desired reactions by increasing either the temperature or the duration of the thermal cycle, or both.

However, simply increasing the reaction temperature may not be possible for some applications. For example, when annealing the device side of a semiconductor wafer, it is not normally desirable or permissible to melt the device side. Thus, the melting point of the wafer (roughly 1414° C. for silicon at atmospheric pressure) imposes a maximum process temperature. Other components of the devices will sustain damage at temperatures less than the melting point. As a result, the ability to increase the process temperature beyond existing annealing temperatures (typically about 1050° C. to about 1350° C.) is inherently limited.

Conversely, the present inventors have concluded that simply increasing the duration of the thermal cycle may also be disadvantageous for some applications. For example, in a flash-assisted rapid thermal processing (fRTP™) of a semiconductor wafer, the duration of the relevant portion of the thermal cycle could be increased by stretching or expanding the temporal pulse width (i.e. the duration) of the irradiance flash. This could be achieved, for example, by increasing the inductance and/or capacitance of the electrical path through which the flash lamp(s) is discharged, thereby causing the pulse to rise and fall more slowly, and by commensurately increasing the stored electrical charge that is used to generate the flash (as the total energy of a pulse for a given peak temperature is roughly proportional to the square-root of the discharge time, each doubling of the pulse width would require about 40% more stored energy in order to achieve the same peak temperature or magnitude). Disadvantageously, however, extending the duration of the flash in this manner not only allows more undesirable diffusion to occur during the longer flash itself, but also supplies more heating energy to the wafer and allows more time for this increased heating energy to conduct into the bulk of the wafer, thereby increasing the bulk temperature of the wafer. Thus, when the flash has ended, the temperature difference between the flash-heated device side and the bulk of the wafer is diminished, resulting in slower cooling of the device side following the flash. This decelerated cooling and elevated bulk temperature allow further undesirable dopant diffusion to occur. As the pulse width is expanded to approach the thermal conduction time of the wafer, the results of the process (both desirable and undesirable) tend to approach those of a more conventional isothermal process in which the wafer is maintained at a uniform temperature at all times, thereby defeating the purpose of flash-assisted RTP and yielding undesirably deep and pervasive dopant diffusion. In addition, such temporal stretching of the pulse width tends to significantly diminish the operating lifetime of electrodes of the flash lamp, and may cause other problems as well, such as premature self-extinguishment of high-power water-wall flash lamps, for example.

To address these difficulties, in accordance with one illustrative embodiment of the invention, there is provided a method of heat-treating a workpiece. The method includes generating an initial heating portion and a subsequent sustaining portion of an irradiance pulse incident on a target surface area of the workpiece. A combined duration of the initial heating portion and the subsequent sustaining portion is less than a thermal conduction time of the workpiece. The initial heating portion heats the target surface area to a desired temperature, and the subsequent sustaining portion maintains the target surface area within a desired range from the desired temperature. The workpiece may include a semiconductor wafer.

Thus, rather than simply stretching a conventional irradiance pulse, a novel pulse shape is provided, in which an initial heating portion that heats the target surface area to the desired temperature is followed by a subsequent sustaining portion that maintains the target surface area within the desired range from the desired temperature, and in which the combined duration of the initial and subsequent portions is less than the thermal conduction time of the workpiece. Advantageously, such a pulse can significantly increase the dwell time of the target surface area within a desired range of less than 50° C. from the desired temperature, thereby commensurately and significantly increasing the desired amount of high-temperature process reactions (such as dopant activation), without significantly increasing the total energy or total duration (10% to 10%) of the pulse. As a result, the average bulk temperature of the workpiece remains cooler and the heated surface therefore cools faster, thereby minimizing undesirable reactions (such as dopant diffusion), in comparison to simply stretching the duration of a conventional pulse to achieve the desired process reactions. Such a novel pulse shape also requires considerably less energy to generate than a temporally stretched conventional pulse shape, as the energy in the pulse increases proportionally to the square root of the pulse duration.

The initial heating portion and the subsequent sustaining portion may be asymmetric.

The sustaining portion may deliver power to the target surface area sufficient to compensate for thermal conduction from the target surface area into a body of the workpiece.

The sustaining portion may also further deliver power to the target surface area sufficient to compensate for heat exchange by thermal radiation and conduction between the target surface area and its environment.

The sustaining portion may deliver power to the target surface area at a rate of at least $1 \times 10^2$ W/cm$^2$, for example.

The desired range may be within about $5 \times 10^{2}$° C. from the desired temperature. For example, the desired range may be within about $1 \times 10^{1}$° C. from the desired temperature. As a more specific example, the desired range may be within about 3° C. from the desired temperature.

The combined duration may be such that a full width at half-maximum (FWHM) of the irradiance pulse is less than half of the thermal conduction time of the workpiece. For example, the FWHM may be about 2 ms.

The combined duration may be such that a full width at one-quarter maximum (FWQM) of the irradiance pulse is less than half of the thermal conduction time of the workpiece. For example, the FWQM may be about 3 ms.

Alternatively, the combined duration may be such that the full width at one-quarter maximum (FWQM) of the irradiance pulse is more than half of the thermal conduction time of the workpiece. For example, the FWQM may be about $1 \times 10^{-2}$ s.

The target surface area may include a device side of the semiconductor wafer, and generating may include generating the irradiance pulse using a plurality of flash lamps.

Generating may include firing at least one of the plurality of flash lamps at an irradiance pulse commencement time, and subsequently firing at least one other of the plurality of flash lamps. For example, generating may include firing at least two of the plurality of flash lamps simultaneously at the irradiance pulse commencement time.

As a further example, subsequently firing may include subsequently firing at least a first other one of the plurality of flash lamps at a first time interval following the irradiance pulse commencement time, and subsequently firing at least a second other one of the plurality of flash lamps at a second time interval following the irradiance pulse commencement time. For example, the first and second time intervals may be about one millisecond and about two milliseconds respectively, following the irradiance pulse commencement time. More particularly, the first and second time intervals may be about 0.8 milliseconds and about 1.8 milliseconds, respectively, following the irradiance pulse commencement time.

Alternatively, the target surface area may include an area segment of a device side of the semiconductor wafer, and generating the irradiance pulse may include scanning a laser beam having an asymmetric spatial profile across the area segment within less than the thermal conduction time of the workpiece.

Thus, in such an embodiment, generating the initial heating portion may include scanning a first spatial portion of the laser beam across the area segment, and generating the subsequent sustaining portion may include scanning a second spatial portion of the laser beam across the area segment, the first spatial portion and the second spatial portion being asymmetric.

The method may further include pre-heating the workpiece to an intermediate temperature less than the desired temperature, prior to generating the irradiance pulse.

The method may further include monitoring at least one parameter indicative of a presently completed amount of a desired thermal process during the irradiance pulse, and modifying the irradiance pulse in response to deviation of the at least one parameter from an expected value.

Modifying may include shortening a duration of the subsequent sustaining portion if the at least one parameter exceeds the expected value by more than a threshold difference.

Conversely, modifying may include lengthening a duration of the subsequent sustaining portion if the expected value exceeds the at least one parameter by more than a threshold difference.

In accordance with another illustrative embodiment of the invention, there is provided an apparatus for heat-treating a workpiece. The apparatus includes an irradiance pulse generating system and a processor circuit configured to control the irradiance pulse generating system to generate an initial heating portion and a subsequent sustaining portion of an irradiance pulse incident on a target surface area of the workpiece. A combined duration of the initial heating portion and the subsequent sustaining portion is less than a thermal conduction time of the workpiece. The initial heating portion heats the target surface area to a desired temperature, and the subsequent sustaining portion maintains the target surface area within a desired range from the desired temperature. The workpiece may include a semiconductor wafer.

The processor circuit may be configured to control the irradiance pulse generating system to cause the initial heating portion and the subsequent sustaining portion to be asymmetric.

The processor circuit may be configured to control the irradiance pulse generating system to cause the sustaining portion to deliver power to the target surface area sufficient to compensate for thermal conduction from the target surface area into a body of the workpiece.

The processor circuit may further be configured to control the irradiance pulse generating system to cause the sustaining portion to deliver power to the target surface area sufficient to compensate for heat exchange by thermal radiation and conduction between the target surface area and its environment.

The processor circuit may be configured to control the irradiance pulse generating system to cause the sustaining portion to deliver power to the target surface area at a rate of at least $1 \times 10^2$ W/cm$^2$, for example.

The desired range may be within about $5 \times 10^{2\circ}$ C. from the desired temperature. For example, the desired range may be within about $1 \times 10^{1\circ}$ C. from the desired temperature. As a more particular example, the desired range may be within about 3° C. from the desired temperature.

The processor circuit may be configured to control the irradiance pulse generating system to cause a full width at half-maximum (FWHM) of the irradiance pulse comprising the initial heating portion and the subsequent sustaining portion to be less than half of the thermal conduction time of the workpiece. For example, the FWHM may be about 2 ms.

The processor circuit may be configured to control the irradiance pulse generating system to cause a full width at one-quarter maximum (FWQM) of the irradiance pulse to be less than half of the thermal conduction time of the workpiece. For example, the FWQM may be about 3 ms.

Alternatively, the processor circuit may be configured to control the irradiance pulse generating system to cause a full width at one-quarter maximum (FWQM) of the irradiance pulse to be more than half of the thermal conduction time of the workpiece. For example, the FWQM may be about $1 \times 10^{-2}$ s.

The target surface area may include a device side of the semiconductor wafer, and the irradiance pulse generating system may include a plurality of flash lamps.

The processor circuit may be configured to control the irradiance pulse generating system to generate the irradiance pulse by firing at least one of the plurality of flash lamps at an irradiance pulse commencement time, and by subsequently firing at least one other of the plurality of flash lamps.

The processor circuit may be configured to control the irradiance pulse generating system to fire at least two of the plurality of flash lamps simultaneously at the irradiance pulse commencement time.

The processor circuit may be configured to control the irradiance pulse generating system to subsequently fire at least a first other one of the plurality of flash lamps at a first time interval following the irradiance pulse commencement time, and to subsequently fire at least a second other one of the plurality of flash lamps at a second time interval following the irradiance pulse commencement time.

The first and second time intervals may be about one millisecond and about two milliseconds respectively, following the irradiance pulse commencement time. For example, the first and second time intervals may be about 0.8 milliseconds and about 1.8 milliseconds, respectively, following the irradiance pulse commencement time.

The target surface area may include an area segment of a device side of the semiconductor wafer, and the irradiance pulse generating system may include a scanning laser configured to generate a laser beam having an asymmetric spatial profile. The processor circuit may be configured to generate the irradiance pulse by controlling the scanning laser to scan the laser beam having the asymmetric spatial profile across the area segment within less than the thermal conduction time of the workpiece.

The processor circuit may be configured to control the scanning laser to generate the initial heating portion by scanning a first spatial portion of the laser beam across the area segment, and to generate the subsequent sustaining portion by scanning a second spatial portion of the laser beam across the area segment, the first spatial portion and the second spatial portion being asymmetric.

The apparatus may further include a pre-heating system, and the processor circuit may be configured to control the pre-heating system to pre-heat the workpiece to an intermediate temperature less than the desired temperature, prior to activation of the irradiance pulse generating system.

The apparatus may further include a measurement system, and the processor circuit may be configured to co-operate with the measurement system to monitor at least one parameter indicative of a presently completed amount of a desired thermal process during the irradiance pulse, and to control the irradiance pulse generating system to modify the irradiance pulse in response to deviation of the at least one parameter from an expected value.

The processor circuit may be configured to control the irradiance pulse generating system to modify the irradiance pulse by shortening a duration of the subsequent sustaining portion if the at least one parameter exceeds the expected value by more than a threshold difference. Conversely, the processor circuit may be configured to control the irradiance pulse generating system to modify the irradiance pulse by lengthening a duration of the subsequent sustaining portion if the expected value exceeds the at least one parameter by more than a threshold difference.

In accordance with another illustrative embodiment of the invention, there is provided an apparatus for heat-treating a workpiece. The apparatus includes means for generating an initial heating portion of an irradiance pulse incident on a target surface area of the workpiece, and means for generating a subsequent sustaining portion of an irradiance pulse incident on a target surface area of the workpiece. A combined duration of the initial heating portion and the subsequent sustaining portion is less than a thermal conduction time of the workpiece. The initial heating portion heats the target surface area to a desired temperature, and the subsequent sustaining portion maintains the target surface area within a desired range from the desired temperature. The workpiece may include a semiconductor wafer.

In accordance with another illustrative embodiment of the invention, there is provided a method of heat-treating a workpiece. The method includes generating an initial heating portion and a subsequent sustaining portion of an irradiance pulse incident on a target surface area of the workpiece. A combined duration of the initial heating portion and the subsequent sustaining portion is less than a thermal conduction time of the workpiece. The method further includes monitoring at least one parameter indicative of a presently completed amount of a desired thermal process during the irradiance pulse, and modifying the irradiance pulse in response to deviation of the at least one parameter from an expected value. The workpiece may include a semiconductor wafer.

Advantageously, by monitoring a parameter indicative of a presently completed amount of a desired thermal process during the irradiance pulse and then modifying the irradiance pulse in response to deviation of the at least one parameter from an expected value, the pulse may be modified to ensure that the desired amount of the desired thermal process is achieved. Thus, further improvements in process consistency and repeatability may be achieved in comparison to the above-mentioned commonly owned US patent application publication no. US 2005/0063453, in which a pulse is modified in response to monitoring process temperature rather than monitoring the presently completed amount of the desired process.

Modifying may include shortening a duration of the subsequent sustaining portion if the at least one parameter exceeds the expected value by more than a threshold difference.

For example, the target surface area may include a device side of the semiconductor wafer, generating may include generating the irradiance pulse using a plurality of flash lamps, and shortening the duration of the irradiance pulse may include prematurely extinguishing an irradiance flash produced by at least one of the plurality of flash lamps.

Alternatively, the target surface area may include an area segment of a device side of the semiconductor wafer, generating the irradiance pulse may include scanning a laser beam having an asymmetric spatial profile across the area segment within less than the thermal conduction time of the workpiece, and modifying the irradiance pulse may include reducing power supplied by the laser beam to the area segment.

Alternatively, modifying may include lengthening a duration of the subsequent sustaining portion if the expected value exceeds the at least one parameter by more than a threshold difference.

For example, the target surface area may include a device side of the semiconductor wafer, generating may include generating the irradiance pulse using a plurality of flash lamps, and lengthening the duration of the subsequent sustaining portion may include increasing an inductance of an electrical pathway through which at least one of the plurality of flash lamps may be discharged.

Alternatively, the target surface area may include an area segment of a device side of the semiconductor wafer, generating the irradiance pulse may include scanning a laser beam having an asymmetric spatial profile across the area segment within less than the thermal conduction time of the workpiece, and modifying the irradiance pulse may include increasing power supplied by the laser beam to the area segment.

In accordance with another illustrative embodiment of the invention, there is provided an apparatus for heat-treating a workpiece. The apparatus includes an irradiance pulse generating system, a measurement system and a processor circuit. The processor circuit is configured to control the irradiance pulse generating system to generate an initial heating portion and a subsequent sustaining portion of an irradiance pulse incident on a target surface area of the workpiece. A combined duration of the initial heating portion and the subsequent sustaining portion is less than a thermal conduction time of the workpiece. The processor circuit is configured to co-operate with the measurement system to monitor at least one parameter indicative of a presently completed amount of a desired thermal process during the irradiance pulse, and to control the irradiance pulse generating system to modify the irradiance pulse in response to deviation of the at least one parameter from an expected value. The workpiece may include a semiconductor wafer.

The processor circuit may be configured to control the irradiance pulse generating system to modify the irradiance pulse by shortening a duration of the subsequent sustaining portion if the at least one parameter exceeds the expected value by more than a threshold difference.

For example, the target surface area may include a device side of the semiconductor wafer, the irradiance pulse generating system may include a plurality of flash lamps, and the processor circuit may be configured to control the irradiance pulse generating system to shorten the duration of the irradiance pulse by prematurely extinguishing an irradiance flash produced by at least one of the plurality of flash lamps.

Alternatively, the target surface area may include an area segment of a device side of the semiconductor wafer, the irradiance pulse generating system may include a scanning laser configured to generate a laser beam having an asymmetric spatial profile, the processor circuit may be configured to generate the irradiance pulse by controlling the scanning laser to scan the laser beam having the asymmetric spatial profile across the area segment within less than the thermal conduction time of the workpiece, and the processor circuit may be configured to control the scanning laser to modify the irradiance pulse by reducing power supplied by the laser beam to the area segment.

Alternatively, the processor circuit may be configured to control the irradiance pulse generating system to modify the irradiance pulse by lengthening a duration of the subsequent sustaining portion if the expected value exceeds the at least one parameter by more than a threshold difference.

For example, the target surface area may include a device side of the semiconductor wafer, the irradiance pulse generating system may include a plurality of flash lamps, and the processor circuit may be configured to control the irradiance pulse generating system to lengthen the duration of the subsequent sustaining portion by increasing an inductance of an electrical pathway through which at least one of the plurality of flash lamps may be discharged.

Alternatively, the target surface area may include an area segment of a device side of the semiconductor wafer, the irradiance pulse generating system may include a scanning laser configured to generate a laser beam having an asymmetric spatial profile, the processor circuit may be configured to generate the irradiance pulse by controlling the scanning laser to scan the laser beam having the asymmetric spatial profile across the area segment within less than the thermal conduction time of the workpiece, and the processor circuit may be configured to control the irradiance pulse generating system to modify the irradiance pulse by increasing power supplied by the laser beam to the area segment.

In accordance with another illustrative embodiment of the invention, there is provided an apparatus for heat-treating a workpiece. The apparatus includes means for generating an initial heating portion of an irradiance pulse incident on a target surface area of the workpiece, and means for generating a subsequent sustaining portion of an irradiance pulse incident on a target surface area of the workpiece. A combined duration of the initial heating portion and the subsequent sustaining portion is less than a thermal conduction time of the workpiece. The apparatus further includes means for monitoring at least one parameter indicative of a presently completed amount of a desired thermal process during the irradiance pulse, and means for modifying the irradiance pulse in response to deviation of the at least one parameter from an expected value. The workpiece may include a semiconductor wafer.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
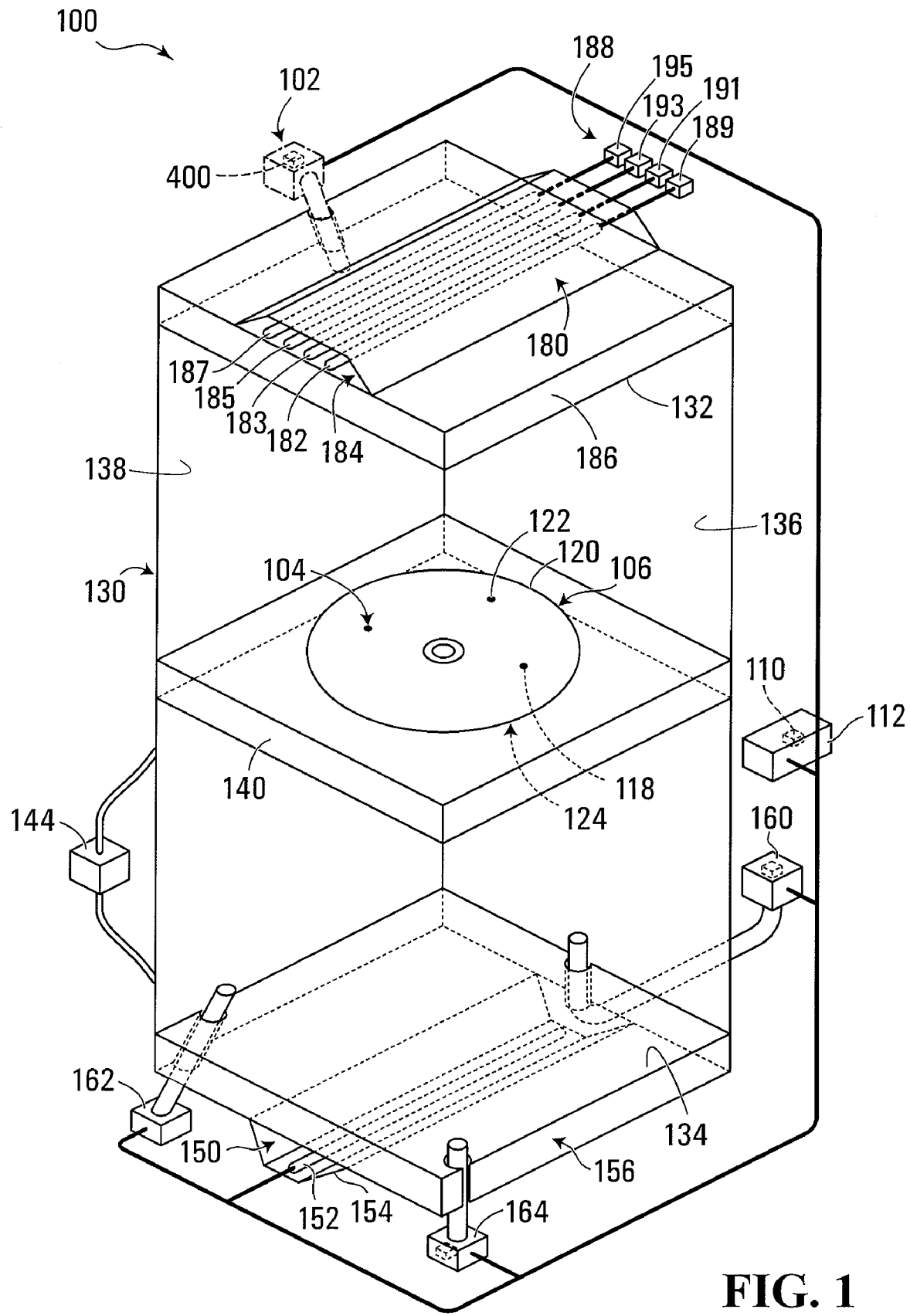
FIG. 1 is a perspective view of a rapid thermal processing (RTP) system according to a first embodiment of the invention, shown with two vertical front-side walls removed.

Referring to FIG. 1, an apparatus for heat-treating a workpiece according to a first embodiment of the invention is shown generally at 100. In this embodiment, the apparatus 100 includes an irradiance pulse generating system 180, and a processor circuit 110.

Figure 5:
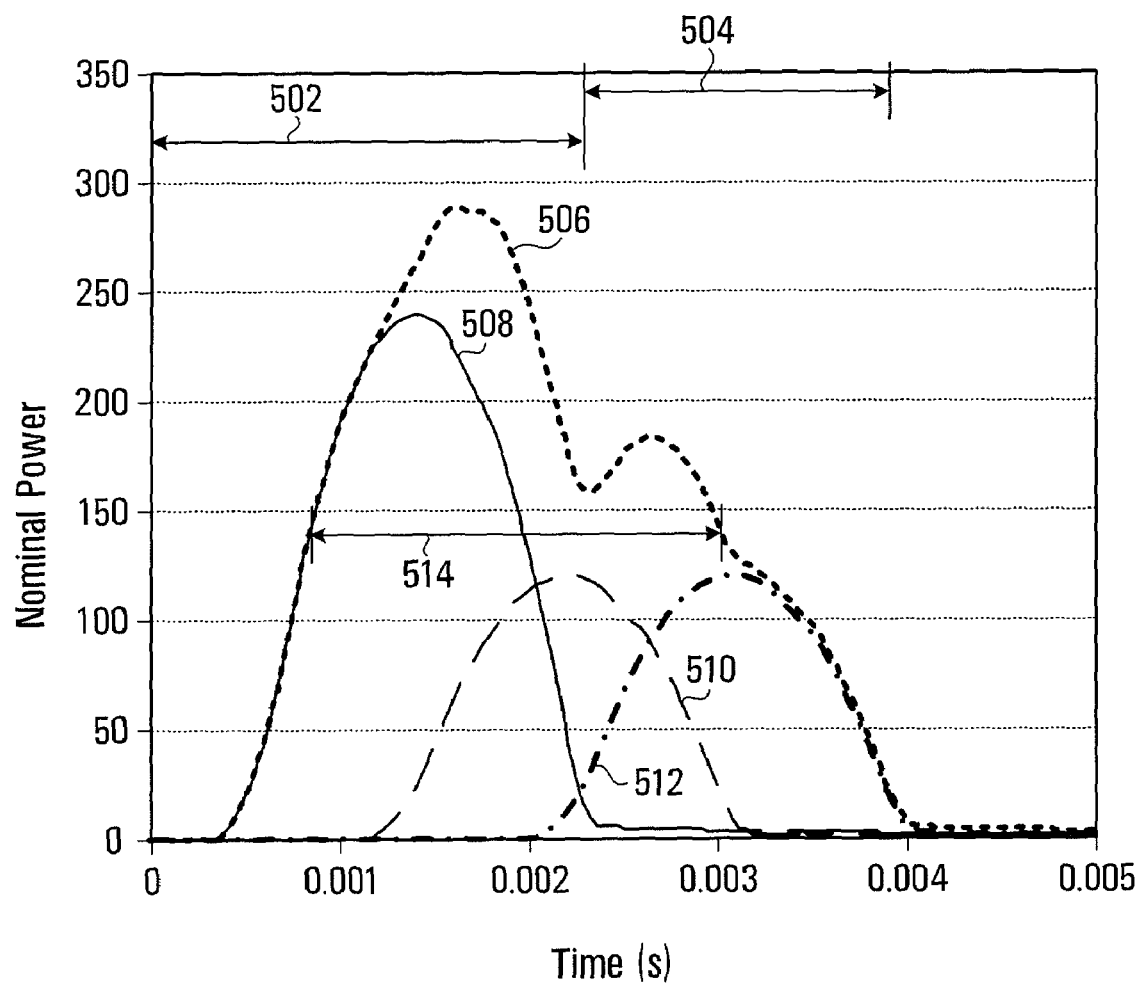
FIG. 5 is a graphical illustration of irradiance power versus time for an irradiance pulse having an initial heating portion and a subsequent sustaining portion, generated by the system shown in FIG. 1.

Referring to FIGS. 1 and 5, in this embodiment the processor circuit 110 is configured to control the irradiance pulse generating system 180 to generate an initial heating portion 502 and a subsequent sustaining portion 504 of an irradiance pulse 506 incident on a target surface area of a workpiece 106. In this embodiment, a combined duration of the initial heating portion 502 and the subsequent sustaining portion 504 is less than a thermal conduction time of the workpiece 106.

Figure 6:
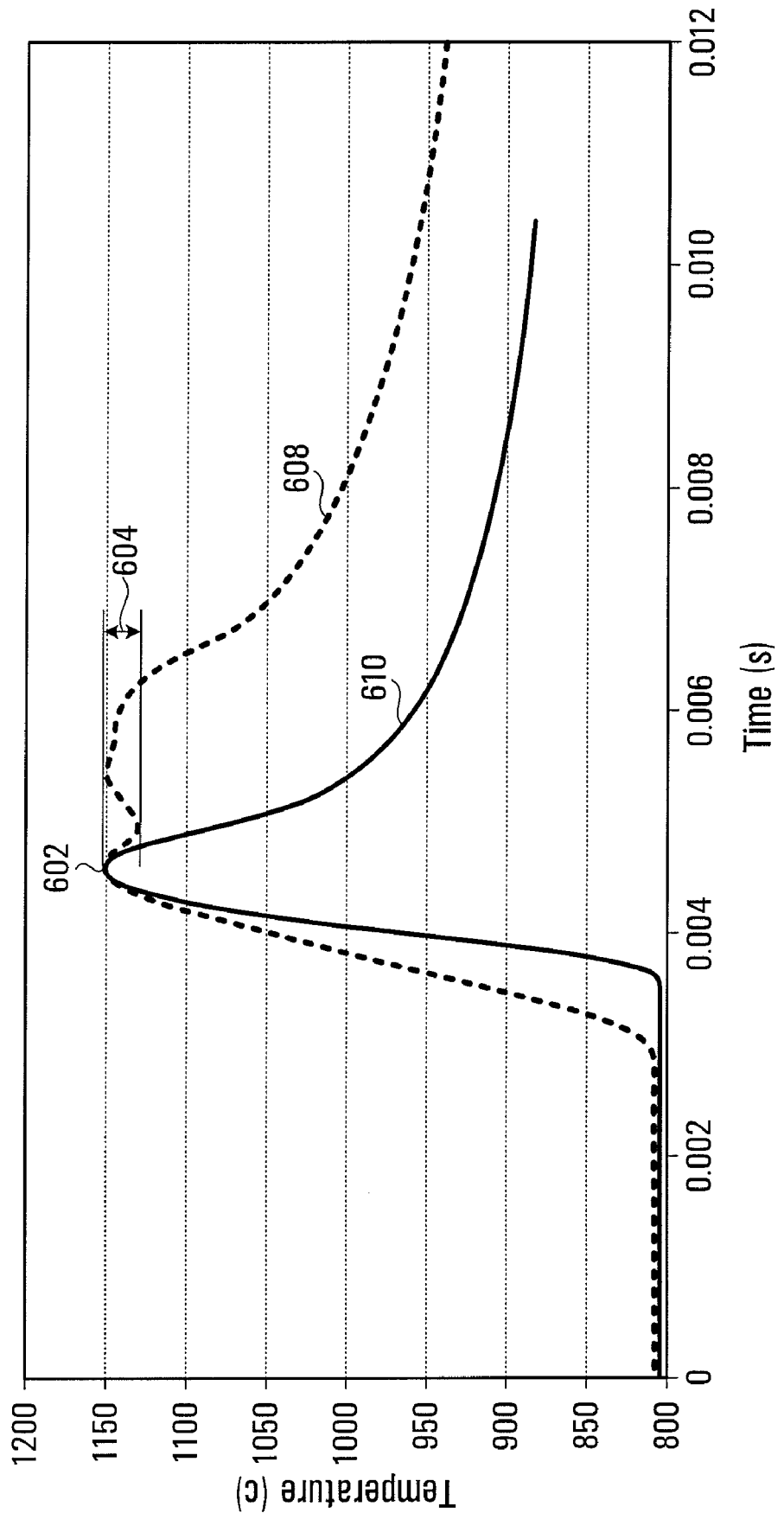
FIG. 6 is a graphical illustration of temperature of the target surface area of the workpiece when subjected to the irradiance pulse shown in FIG. 5.

Referring to FIGS. 1, 5 and 6, in this embodiment the initial heating portion 502 heats the target surface area of the workpiece 106 to a desired temperature 602, and the subsequent sustaining portion 504 maintains the target surface area within a desired range 604 from the desired temperature 602. Workpiece Referring to FIG. 1, in this embodiment, the target surface area includes an entire first surface 104 of the workpiece 106, which in this embodiment is a semiconductor wafer 120. More particularly still, in this embodiment the wafer is a 300 mm diameter silicon semiconductor wafer for use in the manufacture of semiconductor chips, such as microprocessors, for example. In the present embodiment, the first surface 104 of the workpiece 106 includes a top-side or device side 122 of the wafer 120. Similarly, in this embodiment a second surface 118 of the workpiece includes a back-side or substrate side 124 of the wafer 120.

Alternatively, the target surface area need not include the entire first surface 104. For example, in connection with an illustrative embodiment discussed later herein, the target surface area may include a small area segment on the surface 104. More generally, other types of target surface areas, of similar or different types of workpieces, may be substituted.

In this embodiment, prior to the insertion of the wafer 120 into the chamber 130, the device side 122 of the wafer is subjected to an ion implantation process, which introduces impurity atoms or dopants into a surface region of the device side of the wafer. The ion implantation process damages the crystal lattice structure of the surface region of the wafer, and leaves the implanted dopant atoms in interstitial sites where they are electrically inactive. In order to move the dopant atoms into substitutional sites in the lattice to render them electrically active, and to repair the damage to the crystal lattice structure that occurs during ion implantation, the surface region of the device side of the wafer is annealed by heat-treating it as described herein.

Rapid Thermal Processing Chamber

Still referring to FIG. 1, in the present embodiment, the apparatus 100 includes a chamber 130 in which the workpiece 106 is supported for heat-treating, as described herein. Generally, except as discussed herein, the apparatus 100 of the present embodiment is identical to the heat-treating apparatus described in the above-mentioned commonly owned U.S. Patent Application Publication No. US 2007/0069161, which is incorporated herein by reference. Therefore, for conciseness, numerous details of the apparatus 100 disclosed in US 2007/0069161 are omitted.

As discussed in greater detail in US 2007/0069161, in this embodiment the chamber 130 includes top and bottom selectively radiation-absorbing walls 132 and 134, which include selectively absorbing water-cooled windows 186 and 156, respectively. The chamber 130 also includes specularly reflective side walls, two of which are shown at 136 and 138 and the other two of which are removed for illustrative purposes. The workpiece 106 may be supported in a cavity of an internal wall 140 of the chamber 130, by a workpiece support system (not shown) similar to that disclosed in U.S. Patent Application Publication US 2004/0178553, which is incorporated herein by reference. Alternatively, however, the workpiece may be supported by a plurality of quartz pins (not shown), or by any other suitable means. A cooling system 144, which in this embodiment includes a circulated water cooling system, serves to cool the various surfaces of the chamber 130.

The apparatus may include a measurement system 102, which may be used for measuring a temperature of the device side 122 of the wafer 120, or for other purposes, as discussed in connection with a further embodiment described below. Alternatively, the measurement system 102 may be omitted from a given embodiment if desired.

In the present embodiment, the apparatus 100 further includes a pre-heating system 150 for pre-heating the wafer 120. The pre-heating system 150 includes a high-intensity arc lamp 152 and a reflector system 154 disposed beneath the water-cooled window 156, as described in greater detail in US 2007/0069161.

The apparatus 100 may further include a plurality of additional measurement devices, such as a diagnostic illumination source 160, and radiation detectors such as an imaging device 162 and a fast radiometer 164 for example, which may be used as described in US 2007/0069161 and in US 2005/0063453, if desired.

As noted, further details of the apparatus 100 and its structural components and their functions, other than the novel functions and corresponding structural configurations described herein, may be found in US 2007/0069161.

Irradiance Pulse Generating System

Still referring to FIG. 1, in the present embodiment, the apparatus 100 further includes the irradiance pulse generating system 180. In this embodiment, the irradiance pulse generating system 180 includes a flash lamp system. More particularly, in this embodiment the irradiance pulse generating system 180 includes first, second, third and fourth flash lamps 182, 183, 185 and 187 and a reflector system 184, positioned immediately above the water-cooled window 186 of the chamber 130.

Alternatively, fewer than four flash lamps, such as a single flash lamp for example, may be employed. Conversely, more than four flash lamps, such as an array of a much larger number of flash lamps for example, may be employed.

In this embodiment, each of the flash lamps 182 includes a liquid-cooled flash lamp manufactured by Mattson Technology Canada, Inc. of Vancouver, Canada, similar to those described in commonly owned U.S. Patent Application Publication No. US 2005/0179354, which is incorporated herein by reference. In this regard, it has been found that this particular type of flash-lamp provides numerous advantages over more conventional flash-lamps, including improved consistency and repeatability of thermal processing, for example. Alternatively, other types of flash lamps may be substituted. More generally, other types of irradiance pulse generators, such as a microwave pulse generator or a scanning laser for example, may be substituted for the flash lamps.

In the present embodiment, the reflector system 184 is configured to uniformly irradiate the device side 122 of the wafer 120 when the two outer flash lamps, i.e. the first and fourth flash lamps 182 and 187, are fired simultaneously. In this embodiment, the reflector system 184 is also configured to uniformly irradiate the device side 122 of the wafer 120 when either of the two inner flash lamps, i.e. either the second flash lamp 183 or the third flash lamp 185, is fired in isolation. An example of such a reflector system is manufactured by Mattson Technology Canada, Inc. of Vancouver, Canada, as a component of their flash-assisted rapid thermal processing (fRTP™) system.

In the present embodiment, the irradiance pulse generating system 180 further includes a power supply system 188 for supplying electrical power to the flash lamps 182, 183, 185 and 187 to produce the irradiance flash. In this embodiment, the power supply system 188 includes individual electrical power supply systems 189, 191, 193 and 195, for supplying electrical power to the individual flash lamps 182, 183, 185 and 187, respectively.

More particularly, in this embodiment each of the electrical power supply systems 189, 191, 193 and 195 of the power supply system 188 acts as a power supply system for a respective one of the flash lamps 182, 183, 185 and 187, and includes a pulsed discharge unit that may be pre-charged then abruptly discharged in order to supply a "spike" of input power to the respective flash lamp to produce the desired irradiance flash. More particularly still, in the present embodiment, each of the pulsed discharge units includes a pair of 7.9 mF capacitors (not shown) (15.8 mF per pulsed discharge unit), capable of being charged at 3500 V to store up to 96.775 kJ of electrical energy, and capable of discharging such stored energy to its respective flash lamp within a short period of time, such as 0.5 to 1.5 ms, for example. Thus, in this embodiment the irradiance pulse generating system 180 is capable of storing up to 387.1 kJ of electrical energy, and is capable of discharging such energy through the flash lamps 182, 183, 185 and 187 in an irradiance pulse having a total duration less than a thermal conduction time of the workpiece 106. Alternatively, larger or smaller power supplies, or other types of power supplies, may be substituted.

If desired, each of the electrical power supply systems 189, 191, 193 and 195 may include a power control circuit in communication with the pulsed discharge unit and the respective flash lamp, for feedback control of the pulsed discharge that produces each irradiance flash. Alternatively, such power control circuits and feedback control may be omitted if they are not desired for a particular embodiment. By way of illustration, the present embodiment omits such feedback control, while an alternative embodiment described below includes it.

Further details of the individual electrical power supply systems 189, 191, 193 and 195, as well as details of such corresponding power control circuits, are disclosed in the above-mentioned US 2007/0069161.

RTP System Computer (RSC)

Figure 2:
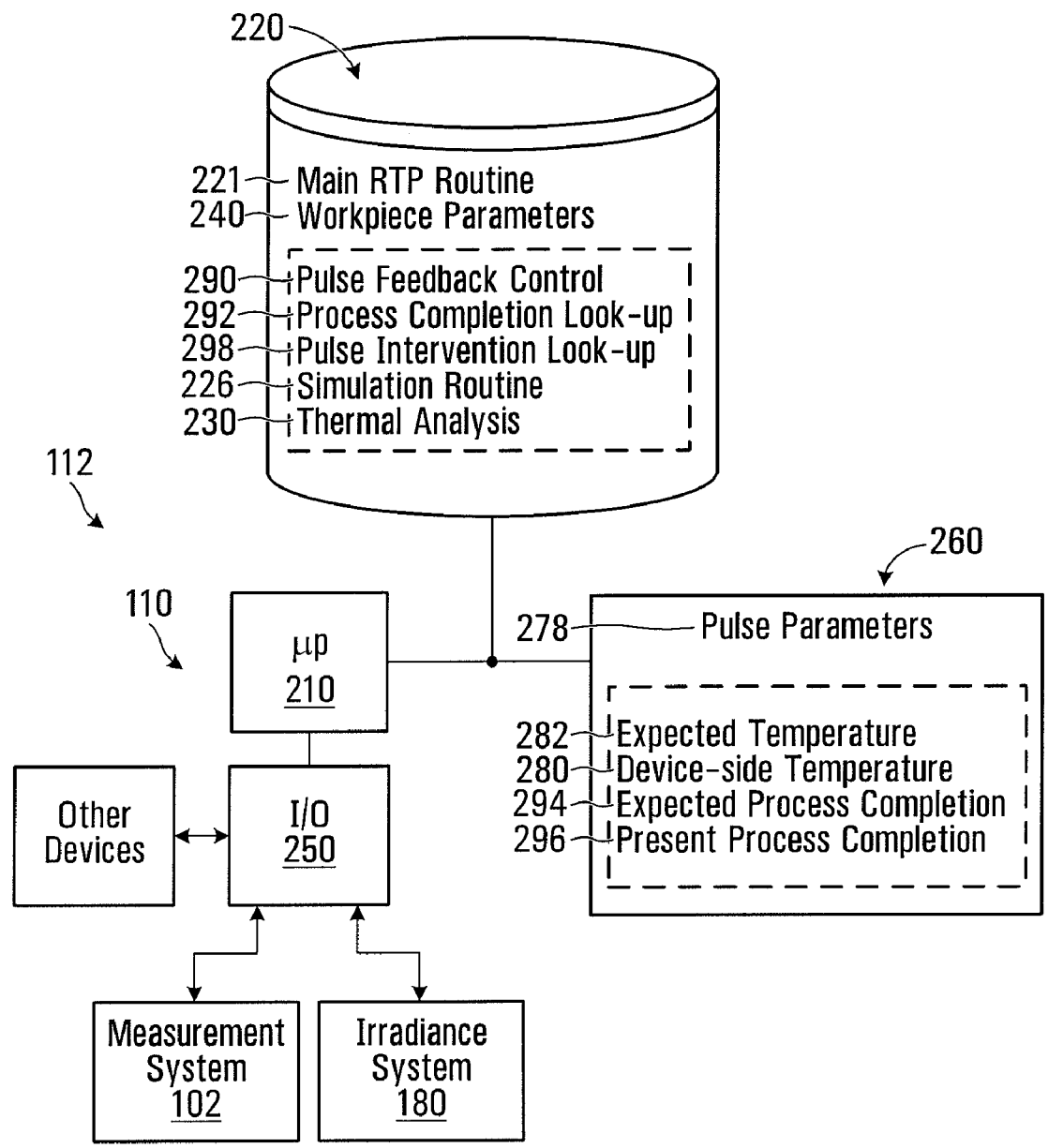
FIG. 2 is a block diagram of a rapid thermal processing system computer (RSC) of the system shown in FIG. 1.

Referring to FIGS. 1 and 2, the RTP System Computer (RSC) 112 is shown in greater detail in FIG. 2. In this embodiment, the RSC includes the processor circuit 110, which in the present embodiment includes a microprocessor 210. More generally, however, in this specification, the term "processor circuit" is intended to broadly encompass any type of device or combination of devices which the present specification and common general knowledge would enable the notional person of ordinary skill in the art to substitute for the microprocessor 210 to perform the functions described herein. Such devices may include (without limitation) other types of microprocessors, microcontrollers, other integrated circuits, other types of circuits or combinations of circuits, logic gates or gate arrays, or programmable devices of any sort, for example, either alone or in combination with other such devices located at the same location or remotely from each other, for example.

In the present embodiment, the microprocessor 210 is in communication with a storage device 220, which in this embodiment includes a hard disk drive. The storage device 220 is used to store one or more routines that configure or program the microprocessor 210 to cause various functions described herein to be performed. More particularly, in this embodiment the storage device 220 stores a main rapid thermal processing (RTP) routine 221, discussed in greater detail below. In this embodiment, the storage device 220 may also be used to store various types of data received or used by the microprocessor 210, such as a workpiece parameters store 240, for example. If desired, the storage device 220 may also store additional routines and data for carrying out additional functions, such as any of the routines and data discussed in the above-mentioned US 2007/0069161, for example.

In the present embodiment, the microprocessor 210 is also in communication with a memory device 260, which in this embodiment includes a random access memory (RAM). In this embodiment, the various routines stored in the storage device 220 configure the microprocessor 210 to define various registers or stores in the RAM for storing various properties or parameters measured, calculated or used by the microprocessor 210, including a pulse parameters store 278, as well as other stores and/or registers (not shown).

The microprocessor 210 of the present embodiment is in further communication with an input/output (I/O) interface 250, for communicating with various devices of the apparatus 100 shown in FIG. 1, including the measurement system 102 (if provided) and the irradiance pulse generating system 180, as well as other system components such as the pre-heating system 150, the diagnostic illumination source 160, the imaging device 162, the fast radiometer 164, and various user input/output devices (not shown) such as a keyboard, a mouse, a monitor, one or more disk drives such as a CD-RW drive and a floppy diskette drive, and a printer, for example. In this embodiment, the I/O interface 250 includes an optical-electrical converter, for communicating with at least some of these devices (such as the fast radiometer 164 and the measurement system 102, for example) via a fiber optic network (not shown), to avoid difficulties posed by electromagnetic interference and electrical noise resulting from large electric currents and sudden electrical discharges required by the pre-heating system 150 and the irradiance pulse generating system 180.

Equivalent Time

In this embodiment, the temporal shape of the irradiance pulse generated by the irradiance pulse generating system 180 has been designed by the present inventors in consideration of the concept of equivalent time for various thermal processes.

For a typical thermal reaction process, the rate of reaction R can be described by the relationship:

$$R(t) \propto e^{\left(\frac{-E_A}{kT(t)}\right)} \quad (1)$$

wherein:
E$_A$ is a reaction energy, i.e. a required energy level for the reaction to occur;
k is Boltzmann's constant; and
T(t) is temperature T as a function of time t.

The total amount of reaction A$_R$ is the integral over time t of the reaction rate R:

$$A_R \propto \int e^{\left(\frac{-E_A}{kT(t)}\right)} dt \quad (2)$$

This relationship facilitates a comparison of the total amount of reaction A$_R$ for different temperature-time profiles T(t), i.e., for different thermal cycles. Equivalent time (t$_{EQ}$) may be defined as a length of time at a constant temperature T$_{EQ}$ that yields the same amount of reaction A$_R$ as would occur during a given time-varying temperature profile T(t):

$$\int_0^{t_{EQ}} e^{\left(\frac{-E_A}{kT_{EQ}}\right)} dt = \int e^{\left(\frac{-E_A}{kT(t)}\right)} dt \quad (3)$$

$$e^{\left(\frac{-E_A}{kT_{EQ}}\right)} t_{EQ} = \int e^{\left(\frac{-E_A}{kT(t)}\right)} dt \quad (4)$$

$$t_{EQ} = \frac{\int e^{\left(\frac{-E_A}{kT(t)}\right)} dt}{e^{\left(\frac{-E_A}{kT_{EQ}}\right)}} \quad (5)$$

It follows from the above that any temperature-time profiles T(t) that have the same equivalent time value t$_{EQ}$ in equation (5) will result in identical amounts of reaction A$_R$. For example, for a given process defined by a given reaction energy E$_A$, a shorter time t$_1$ spent at higher temperatures T$_1$(t) can produce the same amounts of reaction A$_R$ as a longer time t$_2$ spent at lower temperatures T$_2$(t), if the integrals of the two temperature-dependent functions over the two respective time intervals are the same.

The above relationships also facilitate selection of one or more particular thermal cycles T(t) that favor a desired reaction process over an undesired reaction process. For example, if E$_{A1}$ is the reaction energy for a desired thermal reaction process, and E$_{A2}$ is the reaction energy for an undesired thermal reaction process, then the nature of the desired temperature-time profile depends upon the reaction energies E$_{A1}$ and E$_{A2}$. If the reaction energy E$_{A1}$ of the desired process is greater than the reaction energy E$_{A2}$ of the undesired process, then the desired process can be selectively favored and the undesired process can be selectively suppressed by selecting a comparatively shorter time at comparatively higher temperatures.

Conversely, if the reaction energy E$_{A1}$ of the desired process is less than the reaction energy E$_{A2}$ of the undesired process, a comparatively longer time at comparatively lower temperatures will favor the desired process and suppress the undesired process.

In the present embodiment, in which the workpiece 106 is the semiconductor wafer 120, whose device side 122 has been implanted with dopants requiring activation as mentioned above, an activation energy E$_A$ required for the desired process of activating those dopants is typically greater than a diffusion energy E$_D$ that would cause the dopants to undesirably diffuse into the bulk of the wafer 120. For example, depending on the dopant and the wafer in question, the activation energy E$_A$ may be 5 eV or greater (e.g. 5 eV for nominal B implants, or 7 eV for 1 keV 1E14 B implants), while the diffusion energy may be about 3 eV. Accordingly, subjecting the device side 122 to a temperature-time cycle T(t) having as short a duration t at temperatures T as high as possible without causing damage to the devices thereon, tends to maximize the desired activation process while minimizing the undesired diffusion process. The present inventors have appreciated that this may be achieved by subjecting the device side 122 to as "square" a temperature-time profile T(t) as possible, with a rapid increase to the desired annealing temperature followed by a "flat-topped" dwell-time at the annealing temperature, all within significantly less than the thermal conduction time of the workpiece, so that the cooler bulk of the wafer 120 acts as a heat-sink to rapidly cool the heated device side 122 after the dwell-time.

However, the present inventors have also appreciated that merely subjecting the device side 122 to a "square" irradiance pulse shape will not result in the desired "square" temperature-time profile in the device side 122, due to the complicated interaction of such irradiance heating with applicable cooling mechanisms, including conduction of heat from the device side 122 into the cooler bulk of the wafer 120, as well as radiative and conductive heat losses from the device side into the atmosphere contained within the chamber 130. Rather, referring to FIGS. 1 and 3, in this embodiment the processor circuit 110 is configured to control the irradiance pulse generating system 180 to generate an approximation of an irradiance pulse 300 shown in FIG. 3. In this embodiment, the irradiance pulse 300 includes an initial heating portion 302 that heats the device side 122 to a desired temperature, and a subsequent sustaining portion 304 that maintains the device side 122 within a desired range from the desired temperature. More particularly, in this embodiment the sustaining portion 304 maintains the device side 122 at the desired temperature. The irradiance pulse 300 differs from a conventional irradiance pulse shape 306 primarily by virtue of the sustaining portion 304. In this embodiment, the irradiance pulse 300 also has a steeply sloped trailing edge 305, to enhance the rapidity of cooling of the device side 122 after exposure to the sustaining portion 304. Alternatively, however, the trailing edge of the pulse 300 may drop off more continuously and gradually in other embodiments, if rapid cooling is not as important for a particular application.

Figure 3:
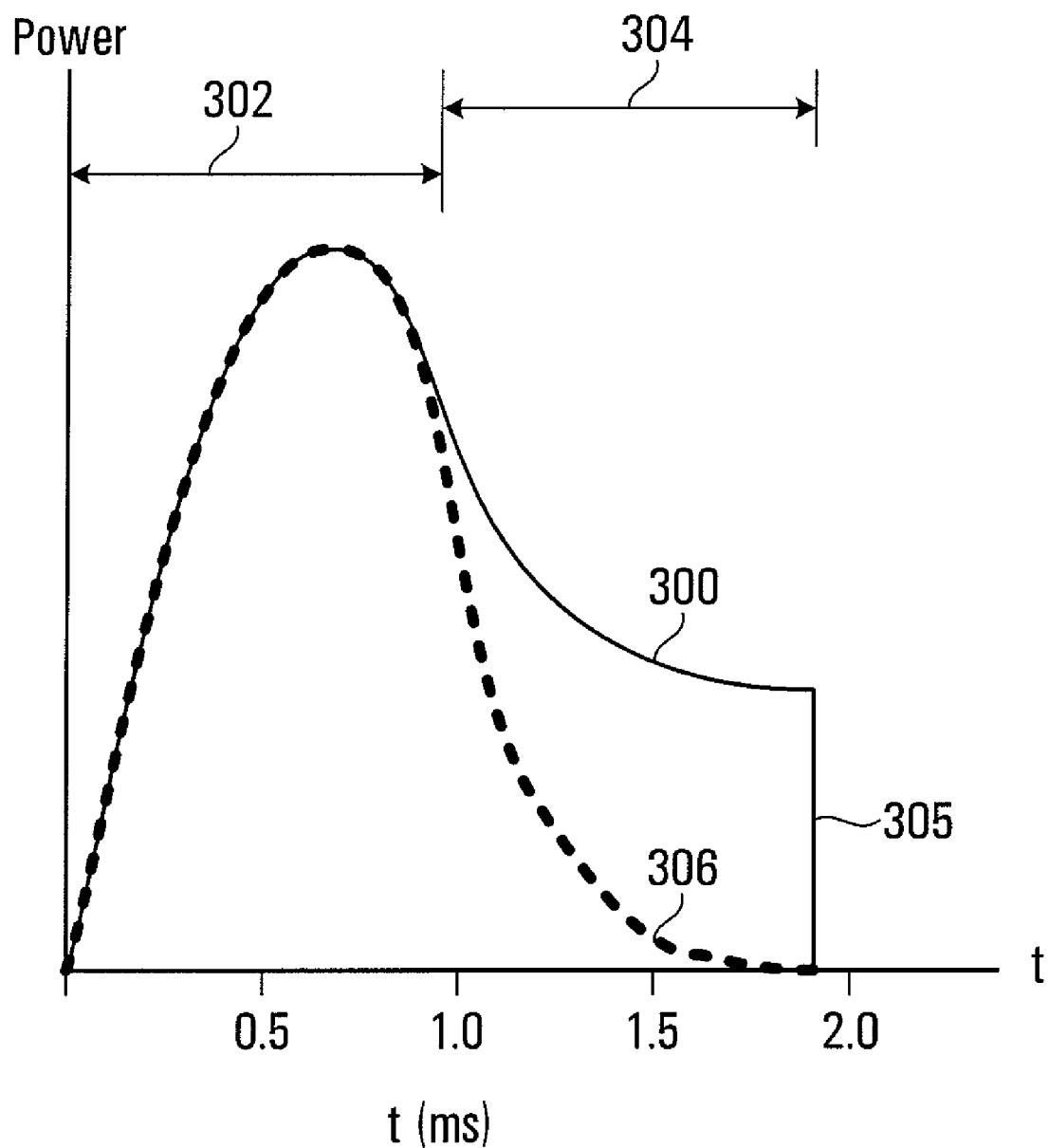
FIG. 3 is a graphical illustration of irradiance power versus time for an exemplary irradiance pulse having an initial heating portion and a subsequent sustaining portion.

Referring to FIGS. 3 and 5, in this embodiment the processor circuit 110 is configured to control the irradiance pulse generating system 180 to produce, as the approximation of the pulse 300, the irradiance pulse 506 shown in FIG. 5, as discussed in greater detail below.

Operation

Figure 4:
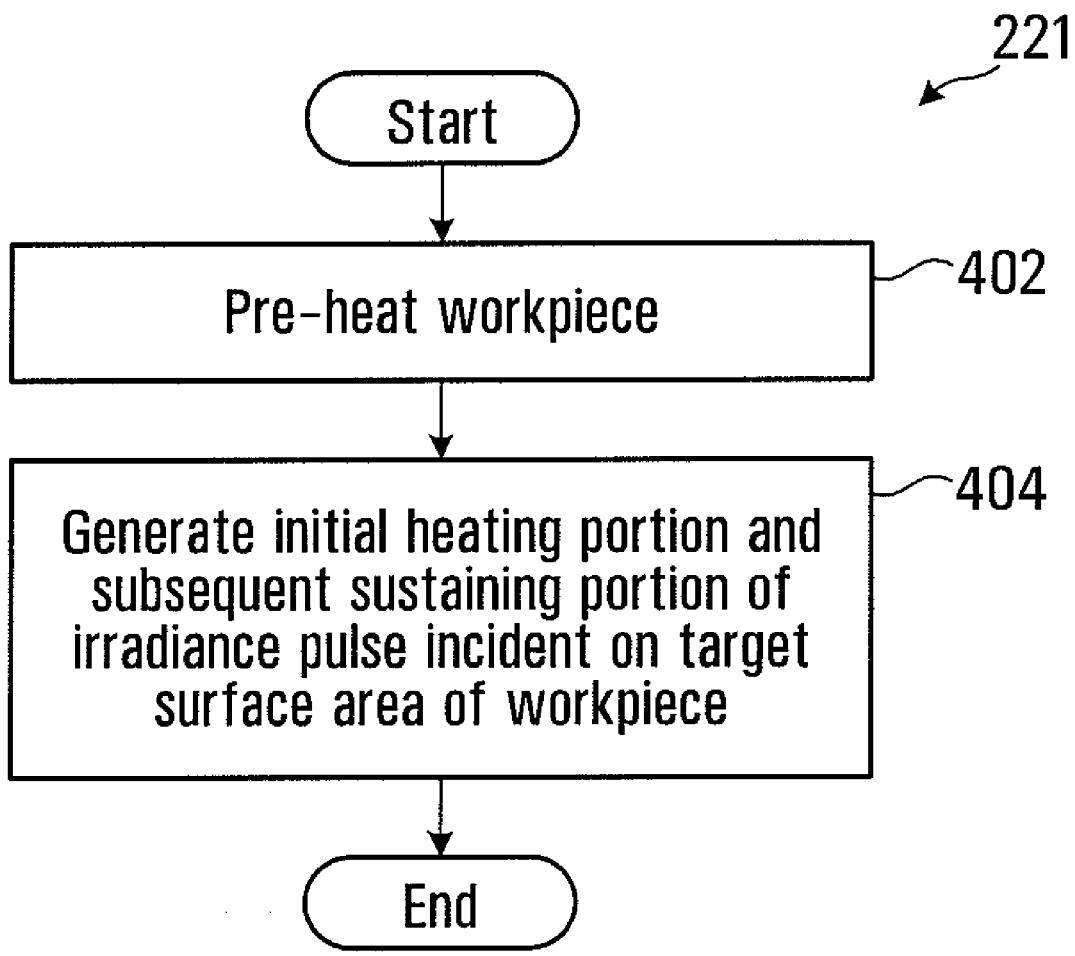
FIG. 4 is a flow chart of a rapid thermal processing routine (RTP) executed by the system shown in FIG. 1.

Referring to FIGS. 1, 2, 4 and 5, the main RTP routine 221 is shown in greater detail in FIG. 4. Generally, in this embodiment the main RTP routine 221 configures the processor circuit 110 to control the irradiance pulse generating system 180 to generate the initial heating portion 502 and the subsequent sustaining portion 504 of the irradiance pulse 506 shown in FIG. 5, incident on the target surface area of the workpiece 106. In this embodiment, a combined duration of the initial heating portion 502 and the subsequent sustaining portion 504 is less than a thermal conduction time of the workpiece 106. The initial heating portion 502 heats the target surface area to a desired temperature, and the subsequent sustaining portion 504 maintains the target surface area within a desired range from the desired temperature.

Referring to FIGS. 1, 2, 4 and 5, the main RTP routine 221 begins with a first block 402 of codes, which directs the processor circuit 110 to prepare the irradiance pulse generating system 180 and the workpiece 106 for the irradiance pulse 506. In this embodiment, block 402 directs the processor circuit to pre-charge the capacitor banks (not shown) of the individual electrical power supply systems 189, 191, 193 and 195 of the flash lamps 182, 183, 185 and 187, to the charging voltages specified in the pulse parameters store 278 in the memory device 260. In the present embodiment, each one of the four capacitor banks is charged to 2700 V. More generally, such charging voltages and other parameters may be calculated or determined as described in the above-mentioned US 2007/0069161, for example, or in any other suitable manner. However, in addition to charging voltages as disclosed in US 2007/0069161, in the present embodiment the pulse parameters store 278 also stores values representing the relative times at which the flash lamps 182, 183, 185 and 187 are to be discharged. In this embodiment, by default these times are set to t=0 for flash lamps 182 and 187, t=0.8 ms for flash lamp 183, and t=1.8 ms for flash lamp 185. Alternatively, as discussed in greater detail below, these relative times may be adjusted by a user under the direction of the main RTP routine 221, if desired.

Block 402 then directs the processor circuit 110 to control the pre-heating system 150 to pre-heat the workpiece 106 to an intermediate temperature less than the desired temperature, prior to activation of the irradiance pulse generating system 180. More particularly, in this embodiment block 402 directs the processor circuit 110 to activate the arc lamp 152 to irradiate the substrate side 124 of the wafer 120 to pre-heat the wafer 120 at a rate of 150° C. per second to an intermediate temperature of approximately 800° C. Block 402 further directs the processor circuit 110 to monitor signals received from the fast radiometer 164 to monitor the temperature of the wafer 120 as it is pre-heated, as described in greater detail in commonly owned US 2005/0063453.

Upon detecting at block 402 that the workpiece 106 has been pre-heated to the intermediate temperature, block 404 directs the processor circuit 110 to control the irradiance pulse generating system 180 to generate the initial heating portion 502 and the subsequent sustaining portion 504 of the irradiance pulse 506 shown in FIG. 5, incident on the target surface area of the workpiece 106.

More particularly, in this embodiment the target surface area of the workpiece 106 includes the device side 122 of the semiconductor wafer 120, and the irradiance pulse generating system 180 includes a plurality of flash lamps, namely, the flash lamps 182, 183, 185 and 187.

In this embodiment, block 404 configures the processor circuit 110 to control the irradiance pulse generating system 180 to generate the irradiance pulse by firing at least one of the plurality of flash lamps at an irradiance pulse commencement time, and by subsequently firing at least one other of the plurality of flash lamps. More particularly, in this embodiment the processor circuit 110 is configured to control the irradiance pulse generating system 180 to fire at least two of the plurality of flash lamps simultaneously at the irradiance pulse commencement time. More particularly still, in this embodiment block 404 directs the processor circuit 110 to control the individual power supply systems 189 and 195 of the irradiance pulse generator system 180 to simultaneously fire the two outside flash lamps, namely, the flash lamps 182 and 187, at the irradiance pulse commencement time. It will be recalled that the reflector system 184 is configured to uniformly irradiate the device side 122 when these two outside flash lamps are fired simultaneously. In this embodiment, the simultaneous firing of the flash lamps 182 and 187 produces a first irradiance pulse component 508 shown in FIG. 5.

In the present embodiment, block 404 then directs the processor circuit 110 to control the irradiance pulse generating system 180 to subsequently fire at least a first other one of the plurality of flash lamps at a first time interval following the irradiance pulse commencement time, and to subsequently fire at least a second other one of the plurality of flash lamps at a second time interval following the irradiance pulse commencement time. More particularly, in this embodiment the processor circuit 110 controls the individual power supply 191 to fire the second flash lamp 183 at the first time interval following the irradiance pulse commencement time, and controls the individual power supply 193 to fire the third flash lamp 185 at the second time interval following the irradiance pulse commencement time. In this embodiment, the first and second time intervals are about one millisecond and about two milliseconds respectively, following the irradiance pulse commencement time. More particularly, in this embodiment the first and second time intervals are about 0.8 milliseconds and about 1.8 milliseconds, respectively, following the irradiance pulse commencement time. In the present embodiment, the firing of the second flash lamp 183 produces a second irradiance pulse component 510, while the firing of the third flash lamp 185 produces a third irradiance pulse component 512. It will be recalled that the reflector system 184 causes each of these irradiance pulse components to uniformly irradiate the device side 122.

Referring to FIG. 5, in this embodiment the first, second and third irradiance pulse components 508, 510 and 512 temporally overlap. Thus, the irradiance pulse generating system 180, by initially simultaneously firing the flash lamps 182 and 187, then subsequently sequentially firing the flash lamps 183 and 185, produces a single continuous irradiance pulse 506, which is the sum of the individual irradiance pulse components 508, 510 and 512.

In this embodiment, a combined duration of the initial heating portion 502 and the subsequent sustaining portion 504 is such that a full width at half-maximum (FWHM) 514 of the irradiance pulse 506 (including the initial heating portion 502 and the subsequent sustaining portion 504) is less than half of the thermal conduction time of the workpiece 106. More particularly, in this embodiment the thermal conduction time of the wafer 120 is on the order of 10-15 milliseconds, and the FWHM 514 of the irradiance pulse 506 is about 2 milliseconds. In this embodiment, the Full Width at One-Quarter Maximum (FWQM) of the irradiance pulse 506 is also less than half of the thermal conduction time of the workpiece. More particularly, in this embodiment the FWQM of the irradiance pulse 506 is about 3 milliseconds. Advantageously, therefore, as the combined duration of the initial heating portion and the subsequent sustaining portion is significantly less than the thermal conduction time of the wafer, the bulk of the wafer remains relatively close to the intermediate temperature to which the wafer was pre-heated at block 402 prior to commencement of the irradiance pulse, allowing the bulk of the wafer to act as an effective heat sink to rapidly cool the device side 122 following termination of the irradiance pulse 506.

Referring to FIGS. 3, 5 and 6, the temperature-time profile of the device side 122 resulting from exposure of the device side to the irradiance pulse 506 is shown generally at 608 in FIG. 6. For illustrative purposes, the temperature-time profile 608 resulting from the irradiance pulse 506 is contrasted with a more conventional temperature-time profile 610 that would result from exposure of the device side 122 to a conventional irradiance pulse shape similar to that shown at 306 in FIG. 3, for example.

Referring to FIGS. 5 and 6, in this embodiment, the initial heating portion 502 and the subsequent sustaining portion 504 are asymmetric. In the present embodiment, the initial heating portion 502 delivers sufficient power to the target surface area (which in this example is the entire device side 122) to heat it to the desired temperature 602, which in this example is about 1150° C. The subsequent sustaining portion 504 then delivers power to the target surface area sufficient to compensate for thermal conduction from the target surface area into the body of the workpiece 106, as well as power sufficient to compensate for heat exchange by thermal radiation and conduction between the target surface area and its environment. In this embodiment, the environment includes the chamber 130 and the atmosphere therein. In alternative embodiments, however, the environment may include other objects, such as a hot plate if the workpiece is pre-heated conductively rather than irradiatively, for example. In the present embodiment, the sustaining portion 504 delivers power to the target surface area at an average rate of at least $1 \times 10^2$ W/cm$^2$, in order to compensate for such thermal conduction and radiation, in order to maintain the target surface area within the desired range 604 from the desired temperature 602.

In this embodiment, the desired range 604 is a range within about $5 \times 10^{1°}$ C. from the desired temperature 602, which in this example is a temperature of about 1150° C. More particularly, in this embodiment the desired range 604 is a range within about $2 \times 10^{1°}$ C. from the desired temperature 602. Alternatively, the desired range 604 may be within about $1 \times 10^{1°}$ C. from the desired temperature 602. As a more particular alternative, the desired range may be within about 3° C. from the desired temperature.

Referring to FIGS. 3, 5 and 6, in this embodiment, the temperature-time profile 608 resulting from exposure of the device side 122 to the irradiance pulse 506 has numerous advantages over the more conventional temperature-time profile 610 resulting from exposure of the device side 122 to a conventional pulse shape similar to that shown at 306. For example, it can be seen that the dwell-time of the device side 122 within a desired range of 50° C. from the desired (peak) temperature 602 is roughly three times longer in the temperature-time profile 608 than in the more conventional temperature-time profile 610, thereby significantly increasing the amount of the desired reaction (activation). Conversely, however, it can be inferred that this increased dwell-time resulting from the pulse 506 only increases the bulk temperature of the workpiece by about 75° C. in comparison to the conventional pulse shape 306, with the result that the pulse 506 still leaves a relatively cold bulk to facilitate rapid device side cooling following the dwell-time, thereby minimizing the undesired lower-energy reaction (diffusion).

Referring back to the concept of equivalent times, it follows from equations (1) to (5) that if the reaction energy of the desired process is an activation energy of $E_A=7$ eV, for example (which is consistent with 1 keV 1E14 B implants), the temperature-time profile 608 results in an equivalent time approximately 100 times greater than that of the conventional temperature-time profile 610.

Even for a lower activation energy of $E_A=5$ eV, for example (consistent with nominal B implants), the temperature-time profile 608 results in an equivalent time approximately 15 times greater than that of the conventional temperature-time profile 610; in other words, the total amount of reaction $A_R$ achieved by the temperature-time profile 608 produced by the irradiance pulse 506 is 15 times greater than that achieved by the temperature-time profile 610 produced by a more conventional irradiance pulse shape similar to that shown at 306.

In stark contrast to the above results flowing from the irradiance pulse 506, if one were to instead attempt to increase the total amount of reaction $A_R$ by a factor of 15 compared to the temperature-time profile 610 by simply stretching the duration or pulse width of the conventional pulse 306, a pulse width approximately 15 times longer, or about 20 ms in duration (FWHM), would be required, which is longer than the typical thermal conduction time of the workpiece. The total energy (which is proportional to the square root of the pulse duration) would increase by a factor of roughly four, and the bulk temperature of the workpiece would increase by roughly 300° C., leaving only a small temperature difference between the bulk and the heated device side, resulting in much slower cooling of the device side. This would effectively approach isothermal heating, with a very long dwell-time and a very long cooling time resulting in large amounts of undesirable diffusion reactions, thereby defeating the purpose of flash-assisted rapid thermal processing.

Figure 12:
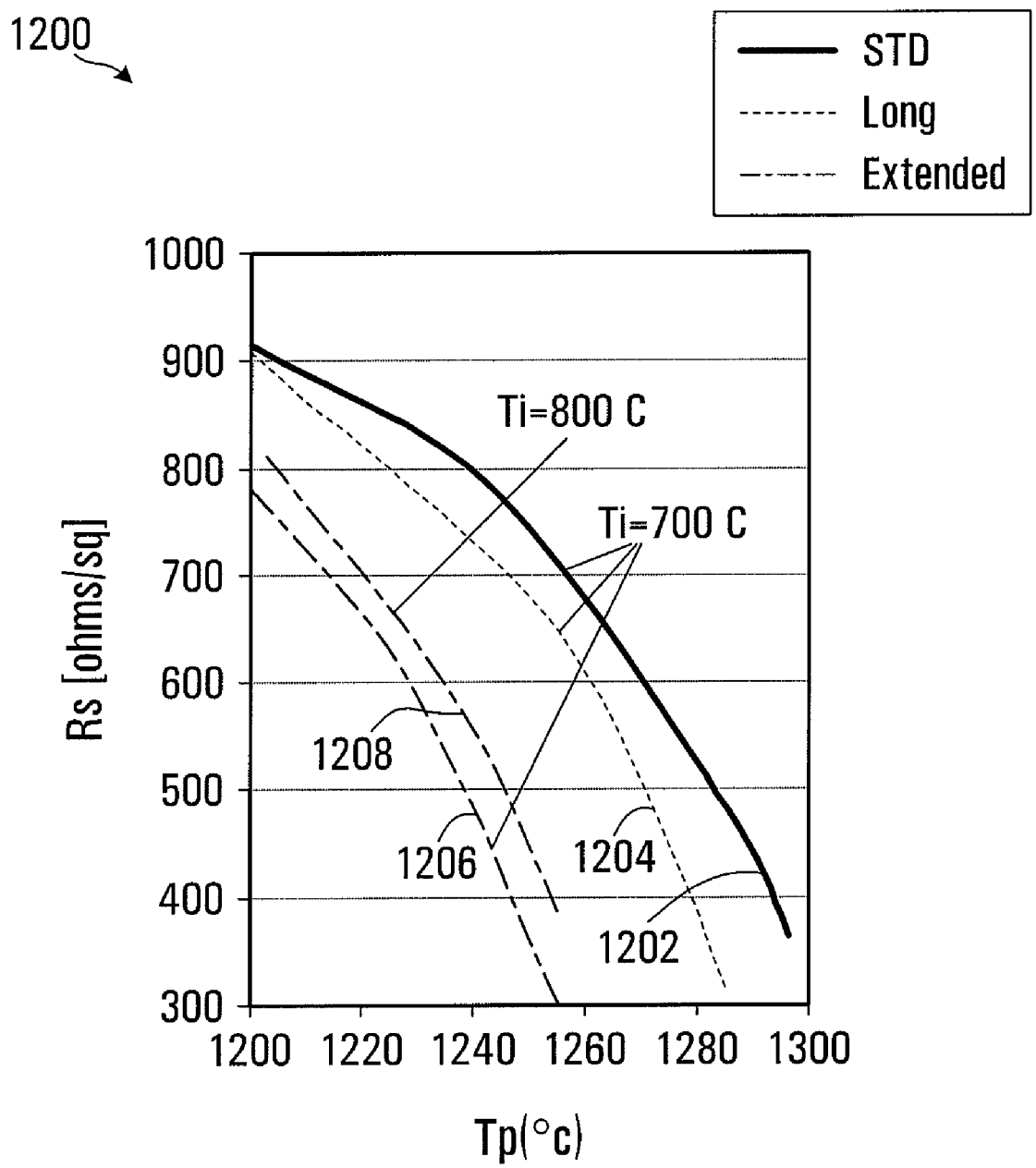
FIG. 12 is a graphical comparison of dopant activation achievable using illustrative embodiments of the invention, to dopant activation achievable using conventional irradiance pulses and from modified stretched conventional pulses.

Referring to FIGS. 3, 5 and 12, sheet resistance $R_S$ as a function of desired process temperature $T_P$ is shown generally at 1200 in FIG. 12. In this embodiment, in which the desired thermal process is activation of implanted dopants, a lower sheet resistance value $R_S$ indicates higher dopant activation and therefore indicates greater achievement of the desired thermal process. FIG. 12 corresponds to thermal cycles for annealing a low energy boron implant (500 eV $10^{15}$ $cm^2$) into crystalline silicon. FIG. 12 shows four different activations curves, each corresponding to a different type of thermal cycle.

More particularly, a first activation curve 1202 corresponds to a plurality of different thermal cycles. In each such thermal cycle, the semiconductor wafer 120 is pre-heated to an intermediate temperature of 700° C., following which the device side 122 is exposed to an irradiance pulse having a conventional or standard (STD) pulse shape such as that shown at 306 in FIG. 3, having a duration (FWHM) of about 0.9 ms, to heat the device side 122 to a desired process temperature $T_P$. The activation curve 1202 illustrates thermal cycles with desired process temperatures $T_P$ ranging from about 1200 to about 1295° C.

A second activation curve 1204 corresponds to a plurality of similar thermal cycles, in which the semiconductor wafer 120 is pre-heated to the same intermediate temperature of 700° C., following which the device side 122 is exposed to an irradiance pulse to heat the device side 122 to a desired process temperature $T_P$. In comparison to the conventional or standard pulse 306, the irradiance pulses of the thermal cycles corresponding to the second activation curve 1204 have been modified by temporally stretching them to have a Full Width at Half-Maximum of about 1.5 ms, but otherwise maintaining their shape, to form a "long" but otherwise conventionally shaped pulse. The activation curve 1204 illustrates thermal cycles with desired process temperatures $T_P$ ranging from about 1200 to about 1285° C.

A third activation curve 1206 corresponds to a plurality of thermal cycles, in which the semiconductor wafer 120 is pre-heated to the same intermediate temperature of 700° C., following which the device side 122 is exposed to an irradiance pulse to heat the device side 122 to a desired process temperature $T_P$. However, rather than using a conventional pulse shape or a stretched conventional pulse shape, the irradiance pulses of the thermal cycles corresponding to activation curve 1206 are generated according to an illustrative embodiment of the invention and have a shape similar to the irradiance pulse 506 shown in FIG. 5. Thus, the irradiance pulse of a given thermal cycle includes an initial heating portion that heats the device side 122 to the desired process temperature $T_P$, and a subsequent sustaining portion that maintains the device side 122 within a desired range from the desired process temperature $T_P$. The activation curve 1206 illustrates thermal cycles with desired process temperatures $T_P$ ranging from about 1200 to about 1255° C.

A fourth activation curve 1208 corresponds to thermal cycles similar to those of the third activation curve 1206, but in which the workpiece is pre-heated to a higher intermediate temperature of 800° C. before exposing the device side 122 to an irradiance pulse according to an embodiment of the invention having an initial heating portion and a subsequent sustaining portion, similar to the pulse 506 shown in FIG. 5. In this regard, the present inventors have found that in embodiments such as those described herein in which the wafer is rapidly irradiatively pre-heated, increasing the intermediate temperature from 700° C. to 800° C. does not result in significant dopant diffusion (typical depth profile movement of less than 2 nm, which is negligible for many applications). The activation curve 1208 illustrates thermal cycles with desired process temperatures $T_P$ ranging from about 1200 to about 1255° C. All four activation curves illustrate that higher process temperatures $T_P$ result in lower sheet resistance $R_S$, and therefore, greater dopant activation. This suggests that if low $R_S$ were the only consideration, the maximum possible temperature should be used. In practice, however, there are counterbalancing considerations that tend to impose limits on the process temperature that should be ideally used.

The first and simplest temperature limit is determined by undesirable or impermissible phase changes of the device structures or silicon substrate, or other undesirable changes that are determined by temperature alone. An example of this is the melting of polysilicon or the silicon substrate.

A second and more complicated limit is determined by thermal stress induced in the wafer exceeding a critical limit. Examples include wafer breakage from tensile stress, or warping due to excessive compressive and/or tensile stress.

As the stress produced in a wafer during flash-assisted thermal processing varies primarily with the magnitude of the temperature jump from the intermediate temperature to the desired process temperature resulting from the flash, a reduction in the magnitude of the temperature jump tends to significantly reduce thermal stress in the wafer. The ability to decrease the magnitude of the jump by increasing the intermediate pre-heat temperature is somewhat limited by the fact that undesirable dopant diffusion occurs at much higher rates within close proximity to suitable activation temperatures, hence the desire to minimize the time spent near the activation temperature through flash-assisted rapid thermal processing as opposed to isothermal heating. Thus, reducing the thermal processing temperature is one possible way to reduce the magnitude of the temperature jump, provided the desired activation levels can be achieved.

FIG. 12 illustrates that a desired level of dopant activation or sheet resistance may be achieved using embodiments of the invention, with lower temperature jumps and hence less stress in the workpiece, than can be achieved using conventional pulse shapes or temporally stretched conventional pulse shapes.

As an arbitrary example, if the desired sheet resistance is $R_S$=400 ohm/sq, starting from an intermediate temperature of 700° C., the first activation curve 1202 illustrates that a conventional pulse would have to achieve a process temperature of 1295° C. In contrast, the third activation curve 1206 illustrates that an irradiance pulse according to an illustrative embodiment of the invention, following pre-heating to the same intermediate temperature of 700° C., would only have to achieve a process temperature of 1250° C. in order to achieve the same sheet resistance of 400 ohm/sq. Thus, in this example, using an irradiance pulse according to an illustrative embodiment of the invention, the magnitude of the temperature jump can be reduced by 45° C. in comparison to a conventional pulse, thereby achieving the same sheet resistance with considerably lower stress generated in the workpiece.

Comparing the third and fourth activation curves 1206 and 1208, which both correspond to irradiance pulse shapes according to illustrative embodiments of the invention but starting from different intermediate temperatures, increasing the intermediate temperature from 700° C. to 800° C. but keeping the process temperature constant tends to increase the sheet resistance by about 60 ohms/sq. An increase of only 5° C. in the desired process temperature $T_P$, from 1250° C. to 1255° C., allows the same desired sheet resistance of 400 ohms/sq to be achieved, but starting from a higher intermediate temperature of 800° C. rather than 700° C., the desired process temperature. Thus, in comparison to a thermal cycle corresponding to the first activation curve 1202, in this example, the magnitude of the temperature jump can be reduced by 140° C. (from 595° C. to 455° C.), thereby achieving the same desired sheet resistance with considerably lower stress generated in the workpiece.

Accordingly, in comparison to thermal cycles similar to those illustrated by the first activation curve 1202 employing conventional pulses, thermal cycles similar to those illustrated by the activation curves 1206 and 1208 employing irradiance pulses according to illustrative embodiments of the invention can achieve comparable sheet resistances with lower process temperatures and reduced temperature jumps from the intermediate temperature to the process temperature. Advantageously, such embodiments tend to significantly reduce stress in the wafer, thereby significantly reducing the probabilities of wafer breakage or warping, in comparison to thermal cycles employing conventional pulses.

Conversely, if desired, thermal cycles employing pulses according to illustrative embodiments of the invention can achieve considerably greater dopant activation and considerably lower sheet resistances without increasing the magnitude of the temperature jump, thereby achieving improved activation results without increasing the likelihood of breakage or warpage.

The ideal balance of temperature and temperature jump may vary for different applications, and may depend upon the sensitivity of the particular device structures to the combination of temperature and stress. Lower stress resulting from lower temperature jumps may allow higher process temperatures without damage.

With respect to diffusion, for thermal cycles similar to those corresponding to the activation curves 1206 and 1208, increasing the desired process temperature from 1200° C. to 1300° C. tends to introduce only a few nm of diffusion. It is believed that such diffusion is small and tends to occur mainly at high concentrations where it will tend to increase abruptness but not increase junction depth, which may be advantageous. These observations are limited to thermal cycles according to embodiments of the invention in which the device side is maintained at the process temperature for significantly less than the thermal conduction time of the wafer, due to the rapid "heat sink" cooling effect of the colder bulk of the wafer. If the device side temperature were to be sustained at 1300° C. for a prolonged period, approaching isothermal heating of the wafer, diffusion would quickly begin to exceed acceptable limits for many contemporary and future applications, defeating the purpose of flash-assisted processing.

Alternatives

Referring back to FIGS. 1 and 2, an apparatus for heat-treating a workpiece according to a second embodiment of the invention includes the apparatus 100 shown in FIG. 1, including the processor circuit 110 and the irradiance pulse generating system 180. Similar to the previous embodiment, the processor circuit 110 is configured to control the irradiance pulse generating system 180 to generate an initial heating portion and a subsequent sustaining portion of an irradiance pulse incident on a target surface area of the workpiece 106, wherein a combined duration of the initial heating portion and the subsequent sustaining portion is less than a thermal conduction time of the workpiece. In this embodiment, however, the apparatus further includes the optional measurement system 102. In the present embodiment, the processor circuit 110 is configured to co-operate with the measurement system 102 to monitor at least one parameter indicative of a presently completed amount of a desired thermal process during the irradiance pulse, and is configured to control the irradiance pulse generating system 180 to modify the irradiance pulse in response to deviation of the at least one parameter from an expected value.

More particularly, in this embodiment the at least one parameter indicative of a presently completed amount of a desired thermal process during the irradiance pulse includes a total amount of reaction $A_R$ which has occurred at time t, as given by equation (2) above.

In this regard, as noted in US 2007/0069161 for example, even ostensibly identical workpieces may in fact have emissivity differences from workpiece to workpiece, resulting in different amounts of energy absorption and hence different magnitudes of thermal cycles, when subjected to identical irradiance cycles. This may cause such ostensibly identical workpieces to experience different amounts of completed thermal process reactions, even if the workpieces are subjected to identical irradiance cycles. Advantageously, therefore, by monitoring a parameter indicative of a presently completed amount of a desired thermal process during the irradiance pulse and then modifying the irradiance pulse in response to deviation of the at least one parameter from an expected value, the pulse may be modified to ensure that the desired amount of the desired thermal process is achieved, irrespective of such workpiece-to-workpiece emissivity differences. Thus, further improvements in process consistency and repeatability may be achieved in comparison to the above-mentioned commonly owned US patent application publication no. US 2005/0063453, in which a pulse is modified in response to monitoring process temperature rather than monitoring the presently completed amount of the desired process.

Figure 7:
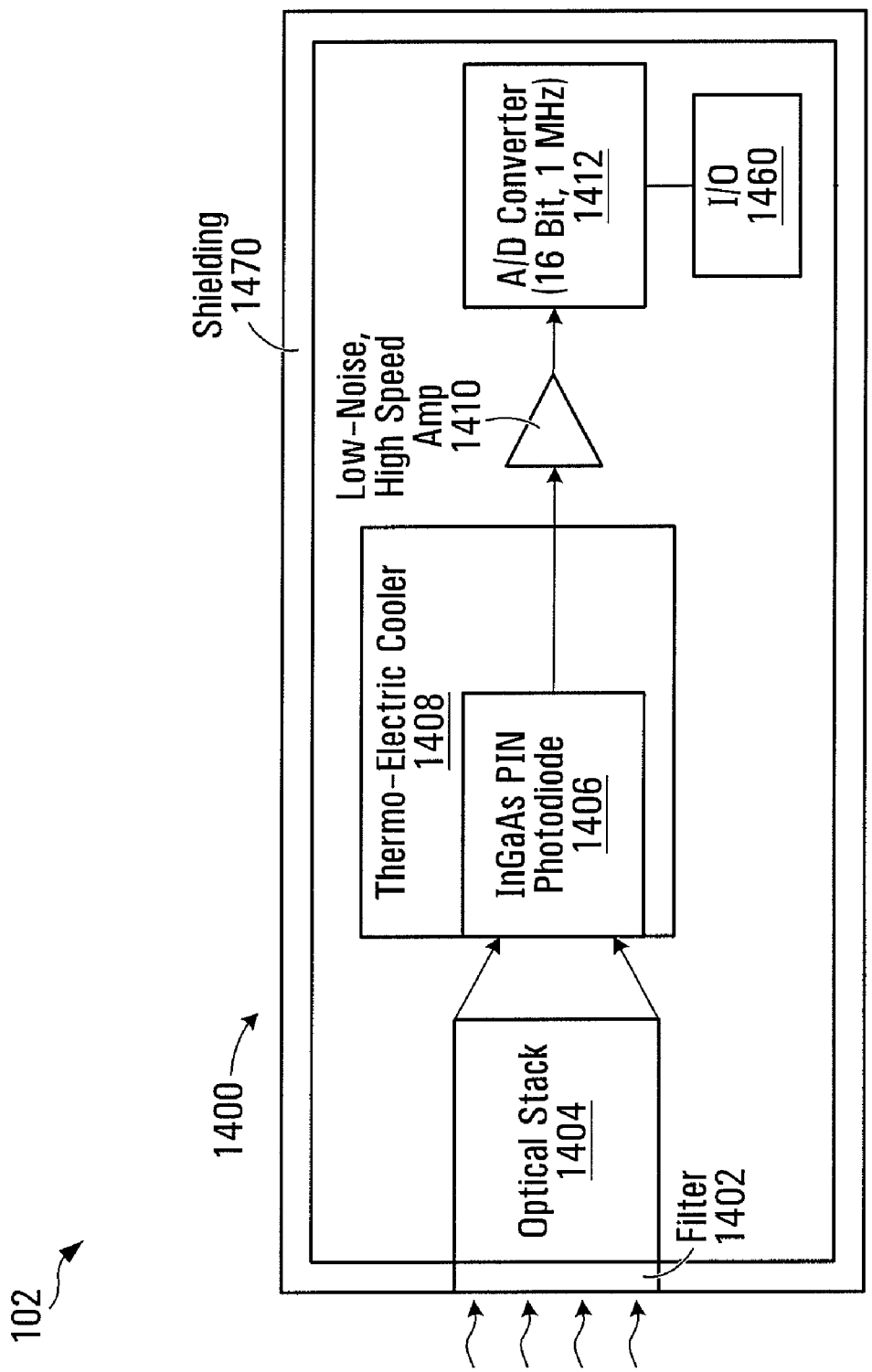
FIG. 7 is a block diagram of an ultra-fast radiometer of a second embodiment of the invention.
Figure 8:
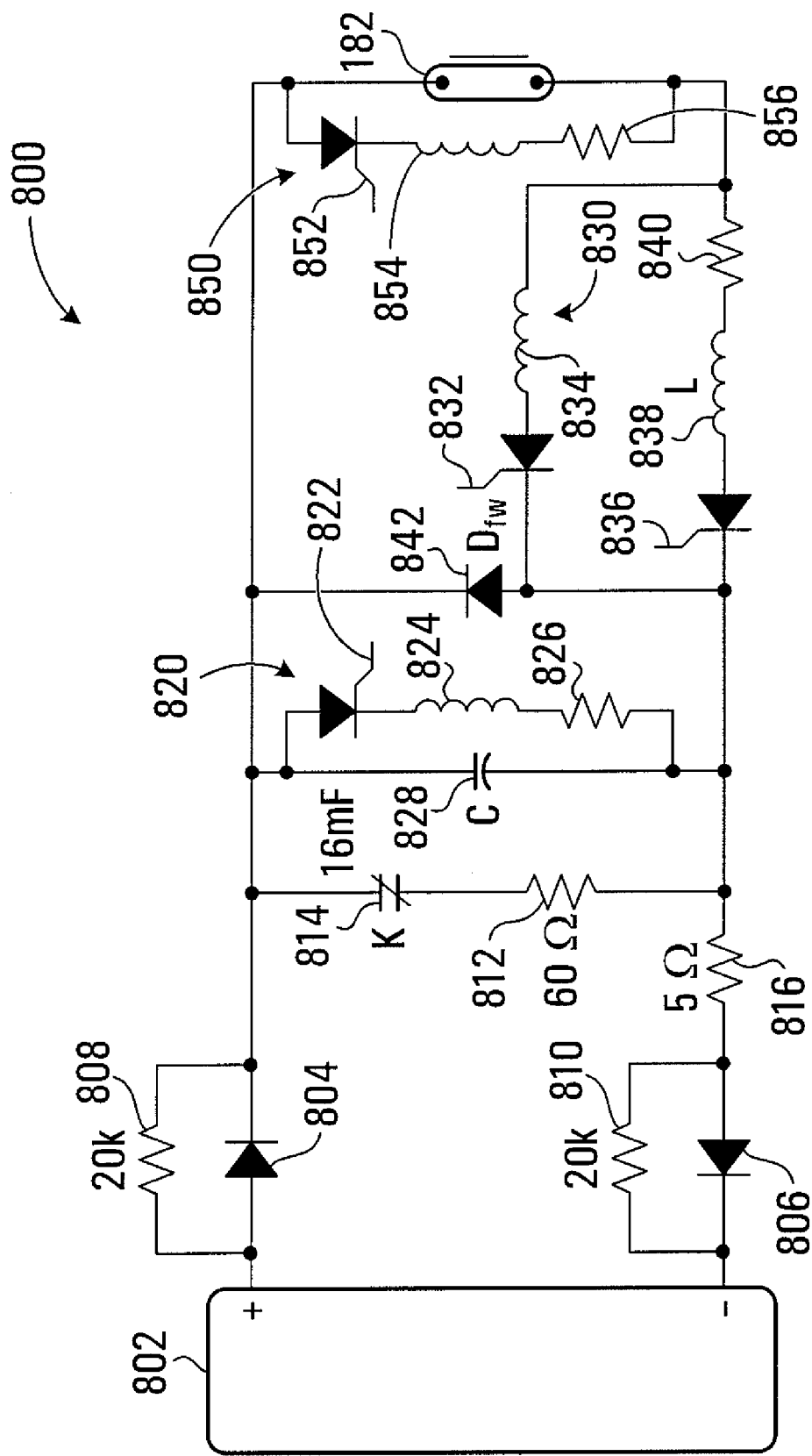
FIG. 8 is a circuit diagram of a power control circuit of a flash-lamp of a rapid thermal processing (RTP) system according to the second embodiment of the invention.

Referring to FIGS. 1 and 7, in this embodiment the measurement system 102 includes an ultra-fast radiometer 1400 described in greater detail in US 2007/0069161, designed to have a wide dynamic range and ultra-fast time response. Thus, in this embodiment the ultra-fast radiometer 1400 includes a 1450 nm narrow-band filter 1402, an optical stack 1404, a high-speed InGaAs PIN photodiode 1406, an integrated thermo-electric cooler 1408, an amplifier 1410, an analog-to-digital (A/D) converter 1412, an input/output (I/O) interface 1460 and shielding 1470, as described in greater detail in US 2007/0069161. Referring to FIGS. 1 and 8, in this embodiment, each of the individual electrical power supply systems 189, 191, 193 and 195 of the power supply system 188 includes a power control circuit such as that shown at 800, in communication with its respective flash lamp 182, 183, 185 or 187. By way of example, only the power control circuit 800 for the flash lamp 182 is shown in FIG. 8. In this embodiment, each power control circuit 800 is identical to a corresponding power control circuit disclosed in US 2007/0069161. Accordingly, in this embodiment, each power control circuit includes: a power supply unit 802; a capacitor bank 828; first and second diodes 804 and 806; first and second resistors 808 and 810; a resistor 812; a dump relay 814; a further resistor 816; a first power reduction circuit shown generally at 820 including an inductor 824, a resistor 826, and a thyristor or silicon-controlled rectifier 822; a power boost circuit shown generally at 830, including a thyristor 832 and an inductor 834; a thyristor 836 for commencing the irradiance flash; an inductor 838; a resistor 840; a free-wheeling diode 842; and a second power reduction circuit shown generally at 850, including an inductor 854, a resistor 856 and a thyristor or silicon-controlled rectifier 852.

These components and their functions are described in greater detail in US 2007/0069161.

Referring back to FIG. 2, in this embodiment the storage device 220 further stores a pulse feedback control routine 290, a process completion look-up table 292, a pulse intervention look-up table 298, a simulation routine 226, and a thermal analysis routine 230. Also in this embodiment, the memory device 260 includes a device-side temperature store 280 for temporarily storing temperature measurements of the device side 122, an expected temperature store 282 for temporarily storing expected temperature values, an expected process completion store 294 for temporarily storing expected values representing amounts of a desired thermal process that are expected to have been completed at various time intervals during the irradiance pulse, and a present process completion register 296 for storing a parameter indicative of a presently completed amount of the desired thermal process during the irradiance pulse.

Figure 9:
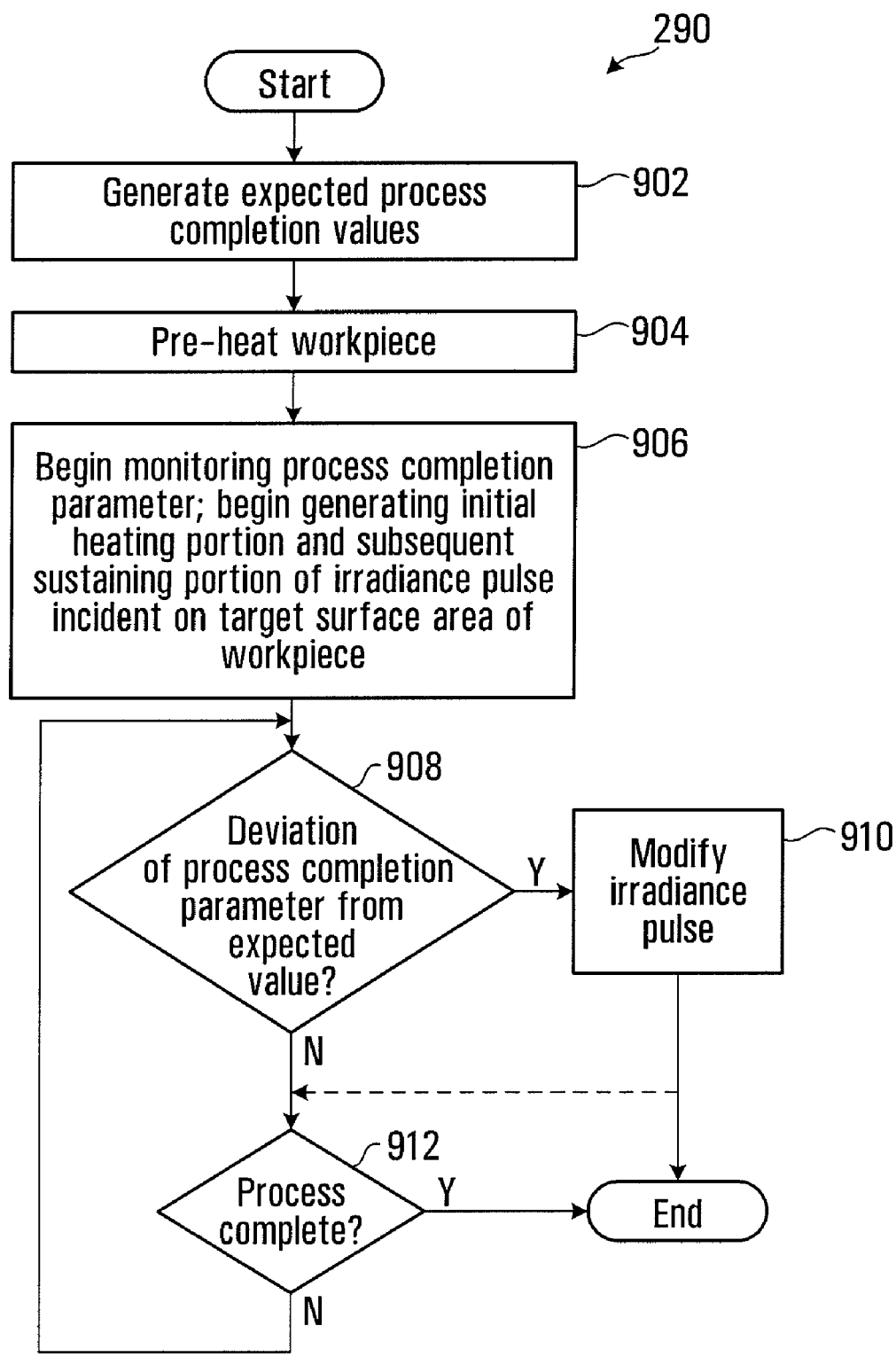
FIG. 9 is a flow chart of a rapid thermal processing (RTP) routine executed by the system shown in FIG. 1, according to the second embodiment of the invention.

Referring to FIGS. 1, 2, 5 and 9, the pulse feedback control routine 290 is shown in greater detail in FIG. 9. Generally, the pulse feedback control routine 290 includes functionality similar to that of the main RTP routine 221, but also configures the processor circuit 110 to control the irradiance pulse generating system 180 to modify the irradiance pulse 506 in real time. More particularly, the pulse feedback control routine 290 configures the processor circuit 110 to co-operate with the measurement system 102 to monitor the at least one parameter indicative of a presently completed amount of a desired thermal process during the irradiance pulse, and to control the irradiance pulse generating system 180 to modify the irradiance pulse in response to deviation of the at least one parameter from an expected value. Advantageously, therefore, if at a given point during the irradiance pulse 506, it appears that significantly less or significantly more of the desired thermal process has occurred than expected (for example, if the device side 122 has a different emissivity than expected, causing it to absorb a different percentage of the irradiance pulse 506 than expected), the processor circuit may control the irradiance pulse generating system to modify the remainder of the irradiance pulse 506 to compensate, thereby bringing the final amount of completed thermal reaction closer to its expected value than it would otherwise have been. As a result, further improvements in wafer-to-wafer repeatability and consistency may be achieved than in US 2007/0069161, in which the irradiance flash was modified only in response to real-time temperature measurements during the flash rather than in response to a parameter indicative of a presently completed amount of the desired thermal process.

In this embodiment, the pulse feedback control routine 290 begins with a first block 902 of codes, which directs the processor circuit 110 to generate a set of expected process completion parameter values for a plurality of respective time intervals during the irradiance pulse 506. In the present embodiment, the pulse parameters and hence the expected irradiance pulse 506 are known, the workpiece parameters and hence the expected resulting temperature-time profile T(t) 608 of the device side 122 are also known, and the activation energy $E_A$ of the desired thermal activation process is known. Accordingly, in this embodiment block 902 directs the processor circuit to generate a set of expected process completion values $A_{RE}(t_n)$ for a plurality of times $t_n$ at 10 µs intervals during the irradiance pulse 506, using equation (2) above. In this embodiment, as the expected process completion values $A_{RE}(t_n)$ are to be compared to actual process completion values, any constant implicit within the right-hand side of equation (2) may be ignored in calculating both the expected and actual process completion values, as it will factor out in the comparison. Thus, the expected process completion values $A_{RE}(t_n)$ may be expressed as follows:

$$A_{RE}(t_n) = \int_{t_0}^{t_n} e^{\left(\frac{-E_A}{kT(t)}\right)} dt \qquad (6)$$

In this embodiment, $t_n$ ranges from $t_0=0$ at the commencement of the irradiance pulse 506, to $t_{400}=4$ ms at the end of the irradiance pulse 506, at 10 microsecond intervals. In this embodiment, this time range ignores expected process completion prior to commencement of the irradiance pulse. As the activation process described by way of example in the present embodiment occurs almost entirely at the high temperatures produced by the irradiance pulse, the amount of reaction occurring during the pre-heating stage preceding the pulse is small. Alternatively, however, reactions that occur during the pre-heating stage may be taken into account, in generating both the expected process completion values and the actual process completion values (discussed below), in the same manner as discussed herein for the values generated for the irradiance pulse stage. Due to the comparatively slower temperature changes during the pre-heating stage, a considerably longer time interval between successive values may suffice. For example, expected process completion values and actual process completion values may be obtained at 1 ms intervals for the pre-heating stage rather than the 10 µs interval employed for the irradiance pulse stage of the present embodiment.

In this embodiment, block 902 directs the processor circuit 110 to store the expected process completion parameters $A_{RE}(t_n)$ in the expected process completion store 294 in the memory device 260.

Alternatively, if the contents of the pulse parameters store 278 and/or the contents of the workpiece parameters store 240 correspond to a thermal cycle for which either the expected irradiance pulse 506 or the expected temperature-time profile 608 or both are not known in advance, block 902 may direct the processor circuit to predict the expected irradiance pulse 506, to predict the temperature-time profile 608, and thus to obtain the expected process completion values as described above. For example, block 902 may instead direct the processor circuit 110 to first execute a simulation routine 226, to predict the irradiance pulse 506 that will be generated by the irradiance pulse generating system 180. More particularly, in this embodiment the simulation routine 226 includes LIGHT-TOOLS™ 3D solid modelling and illumination analysis software, available from Optical Research Associates of Pasadena, Calif., USA. The simulation routine 226 directs the processor circuit to read the contents of the pulse parameters store 278 (including capacitor bank charging voltage and relative discharge times for each of the flash lamps 182, 183, 185 and 187), to analyze the optical and geometric properties of the apparatus 100, and to calculate the amounts of energy of the irradiance pulse 506 that will actually arrive at the device side 122. Block 902 may then direct the processor circuit to execute the thermal analysis routine 230, to calculate the expected temperature-time profile 608 that will result from the irradiance pulse 506. In this embodiment, the thermal analysis routine 230 includes TAS Thermal Analysis Software, manufactured by Harvard Thermal Inc. of Harvard, Mass., USA; a newer version, ANSYS® TAS™ Thermal Analysis System, is now available from Harvard's successor, ANSYS, Inc. of Canonsburg, Pa., USA. Alternatively, other ways of determining an expected temperature trajectory for the device side 122 of the wafer 120 may be substituted. The resulting expected temperature data may be temporarily stored in the expected temperature store 282 in the memory device 260, and may then be used to calculate a set of expected process completion values $A_{RE}(t_n)$ as described above.

In this embodiment, block 904 then directs the processor circuit 110 to prepare the irradiance pulse generating system 180 and the workpiece 106 for the irradiance pulse 506 by pre-charging the capacitor banks 828 of the individual electrical power supply systems 189, 191, 193 and 195 of the flash lamps 182, 183, 185 and 187, to the charging voltages specified in the pulse parameters store 278 in the memory device 260.

Block 904 then directs the processor circuit 110 to control the pre-heating system 150 to pre-heat the workpiece 106 to an intermediate temperature less than the desired temperature, and to monitor signals received from the fast radiometer 164 to monitor the temperature of the wafer 120 as it is pre-heated, as described in greater detail above in connection with block 402 and as described in US 2005/0063453.

Upon detecting at block 904 that the workpiece 106 has been pre-heated to the intermediate temperature, block 906 directs the processor circuit 110 to control the irradiance pulse generating system 180 to generate the initial heating portion 502 and the subsequent sustaining portion 504 of the irradiance pulse 506 as discussed above in connection with block 404, while simultaneously beginning to co-operate with the measurement system 102 to monitor the parameter indicative of a presently completed amount of the desired thermal activation process. Block 906 continues to execute as a thread, thereby continuing to generate the remainder of the irradiance pulse 506 while continuing to monitor the process completion parameter, during the subsequent execution of blocks 908 to 912 discussed below.

To achieve such monitoring of the process completion parameter, in this embodiment block 906 first directs the processor circuit 110 to begin receiving temperature measurement signals from the measurement system 102 representing the real-time temperature of the device side 122 of the wafer 120 during the irradiance pulse, as described in greater detail in US 2007/0069161 or in US 2005/0063453, for example. In this embodiment, block 906 directs the processor circuit 110 to receive a device side temperature measurement from the measurement system 102 every 10 microseconds during the irradiance flash, and to store each such measurement in the device-side temperature store 280, in a field corresponding to the time interval at which the measurement was taken.

In this embodiment, as each such temperature measurement is received and stored, block 906 directs the processor circuit to calculate and store the parameter indicative of a presently completed amount of the desired process. If sufficient processing power and speed are available, block 906 may direct the processor circuit to integrate equation (2) over each time interval to calculate the actual amount $\Delta A_{RA}$ of the desired activation process that has been completed in the most recent time interval.

Alternatively, however, other ways of obtaining the actual amount of the process that has been completed may be substituted. For example, a family of temperature curves may be pre-calculated and the measured temperature value may be compared to them to predict the integration of the exponential term of equation (2) over the most recent time interval.

Or, as a further example, in the present embodiment, the process completion look-up table 292 is used to calculate the actual amount $\Delta A_{RA}$ of the desired thermal process that has been completed in the most recent time interval.

In this embodiment, the process completion look-up table 292 is pre-calculated and stored. As one illustrative example of how to achieve this, if the true temperature-time curve of the device side 122 is approximated as a step-wise function, whose measured value $T_{Mn}$ is assumed to have remained constant within the 10 μs time interval $(t_{n-1}, t_n)$ during which it was measured, but whose measured value can be a different constant value in any of the other 10 μs time intervals in which it is measured, then for each 10 μs time interval $(t_{n-1}, t_n)$, the integral of equation (2) becomes an integral of a constant, i.e., $$\Delta A_{RA_n} = \int_{t_{n-1}}^{t_n} e^{\left(\frac{-E_A}{kT_{Mn}}\right)} dt = e^{\left(\frac{-E_A}{kT_{Mn}}\right)}(10^{-5} \sec) \qquad (7)$$

Therefore, in this embodiment the process completion look-up table 292 includes a first column to specify a desired activation energy $E_A$, a second column to specify a measured temperature $T_{Mn}$, and a third column storing a corresponding pre-calculated value of $\Delta A_{RA_n}$ from equation (7). For each 10 μs time interval, block 906 directs the processor circuit 110 to use the known activation energy $E_A$ and the measured temperature $T_{Mn}$ to locate a corresponding value $\Delta A_{RA_n}$ representing the approximate amount of the desired process that has occurred during the 10 μs interval during which $T_{Mn}$ was measured. Block 906 then directs the processor circuit 110 to add the located value $\Delta A_{RA_n}$ to the contents of the present process completion register 296 (which in this embodiment are initially set to zero at time t=0). Thus, at any given time interval $t_n$, the present process completion register 296 contains a value, $$A_{RA}(t_n) = \sum_n \Delta A_{RA_n} \qquad (8)$$

representing the sum of the amounts of the desired activation process that occurred in all of the time intervals that have elapsed thus far through time $t_n$. In other words, at time $t_n$, the contents of the present process completion register include a parameter indicative of the presently completed amount of the desired thermal activation process at time $t_n$. As discussed above in connection with the expected values $A_{REn}(t_n)$, although the present illustrative embodiment generates and compares expected and actual process completion values only during the irradiance pulse heating stage, alternatively, such values may also be generated and compared for the pre-heating stage as well.

In this embodiment, block 908 then directs the processor circuit 110 to monitor the parameter indicative of the presently completed amount of the desired thermal process. More particularly, block 908 directs the processor circuit 110 to read the contents $A_{RA}(t_n)$ of the present process completion register 296, and to compare those contents to the expected process completion value $A_{RE}(t_n)$ stored in the field of the expected process completion store 294 corresponding to the present time interval $t_n$. If the value of the parameter $A_{RA}(t_n)$ stored in the present process completion register 296 deviates from the expected value $A_{RE}(t_n)$ stored in the addressed field of the expected process completion store 294, the processor circuit 110 is directed to control the irradiance pulse generating system to modify the irradiance pulse 506. More particularly, if at block 908 the present process completion register 296 contents deviate from those of the addressed field of the expected process completion store 294 by more than a threshold difference, block 910 directs the processor circuit to modify the irradiance pulse 506 to attempt to counteract the deviation. In this embodiment, the threshold difference is 1% of the expected value. Alternatively, other thresholds may be substituted, depending upon the level of repeatability desired for a particular application.

More particularly still, in this embodiment, if at block 908 the parameter stored in the present process completion register 296 exceeds the expected value stored in the expected process completion register 294 by more than the threshold difference, block 910 configures the processor circuit 110 to control the irradiance pulse generating system 180 to modify the irradiance pulse 506 by shortening a duration of the subsequent sustaining portion 504.

In this embodiment, to shorten the duration of the irradiance pulse, block 910 directs the processor circuit to control the irradiance pulse generating system 180 to prematurely extinguish an irradiance flash produced by at least one of the plurality of flash lamps 182, 183, 185 and 187. More particularly, in this embodiment block 910 directs the processor circuit 110 to use the difference between the present and expected process completion values to locate and address a corresponding record in the pulse intervention look-up table 298 stored in the storage device 220. The sign of the difference (positive or negative) indicates whether one or more lamps are to be extinguished or boosted, respectively; in this example, a positive difference ($A_{RA}(t_n) > A_{RE}(t_n)$) indicates that one or more flash lamps should be prematurely extinguished. The magnitude of the difference identifies one or more of the flash lamps that should be prematurely extinguished, and identifies times at which they should be extinguished. For example, if the difference between the present and expected process completion values only slightly exceeds the threshold difference, the corresponding record in the pulse intervention look-up table 298 may store an identification of only the third flash lamp 185 which produces the third irradiance pulse component 512, and may store an intervention time falling relatively late within the duration of the third irradiance pulse component 512. Conversely, if the difference between the present and expected process completion values grossly exceeds the threshold difference, then the corresponding record in the pulse intervention look-up table 298 may store identifications of both the second and third flash lamps 183 and 185, and may store extinguishment times that instruct the processor circuit 110 to extinguish both the second and third irradiance pulse components 510 and 512 relatively early in the duration of the irradiance pulse 506. Alternatively, all of the flash lamps may be extinguished, either at the same time or at different times.

In this embodiment, once such an extinguishment time (or times) has been determined, while awaiting the arrival of the extinguishment time, block 910 directs the processor circuit to continue to monitor the actual process completion value $A_{RA}(t_n)$ and compare it to the expected process completion value $A_{RE}(t_n)$ at successive time intervals preceding the extinguishment time, as discussed above at block 908. Block 910 directs the processor circuit to continue to consult the pulse intervention look-up table 298 at successive time intervals as described above, to re-confirm, and if necessary to revise, the extinguishment time based upon further comparisons of the actual and expected process completion values at successive time intervals as the extinguishment time approaches.

In the present embodiment, upon arrival of the extinguishment time, block 910 directs the processor circuit to apply a gate voltage to the thyristor 822 of the power reduction circuit 820 of the power control circuit 800 of the flash lamp(s) specified by the pulse intervention look-up table 298. The extinguishment of the flash lamp in this manner is described in greater detail in US 2007/0069161.

Conversely, if at block 908 the expected value stored in the expected process completion store 294 exceeds the parameter stored in the present process completion register 296 by more than the threshold difference, block 910 configures the processor circuit 110 to control the irradiance pulse generating system 180 to modify the irradiance pulse 506 by lengthening a duration of the subsequent sustaining portion 504. More particularly, block 910 directs the processor circuit 110 to use the difference between the present and expected process completion values to locate and address a corresponding record in the pulse intervention look-up table 298. The sign of the difference (positive or negative) indicates whether one or more lamps are to be extinguished or boosted, respectively; in this example, a negative difference ($A_{RA}(t_n) < A_{RE}(t_n)$) indicates that one or more flash lamps should be boosted. The magnitude of the difference identifies one or more of the flash lamps that should be boosted, and identifies times at which they should be boosted. For example, if the difference between the present and expected process completion values only slightly exceeds the threshold difference (which in this embodiment is 1% of the expected value), the corresponding record in the pulse intervention look-up table 298 may store an identification of only the third flash lamp 185 which produces the third irradiance pulse component 512, and may store an intervention time falling relatively late within the duration of the third irradiance pulse component 512. Conversely, if the difference between the present and expected process completion values grossly exceeds the threshold difference, then the corresponding record in the pulse intervention look-up table 298 may store identifications of both the second and third flash lamps 183 and 185, and may store boost times that instruct the processor circuit 110 to boost both the second and third irradiance pulse components 510 and 512 relatively early in the duration of the irradiance pulse 506.

Again, in this embodiment, once such a pulse boost time (or times) has been determined, while awaiting the arrival of the boost time, block 910 directs the processor circuit to continue to monitor the actual process completion value $A_{RA}(t_n)$ and compare it to the expected process completion value $A_{RE}(t_n)$ at successive time intervals preceding the boost time, as discussed above at block 908. Block 910 directs the processor circuit to continue to consult the pulse intervention look-up table 298 at successive time intervals as described above, to re-confirm, and if necessary to revise, the boost time based upon further comparisons of the actual and expected process completion values at successive time intervals as the boost time approaches.

In the present embodiment, upon arrival of the boost time, block 910 directs the processor circuit 110 to control the irradiance pulse generating system 180 to lengthen the duration of the subsequent sustaining portion by increasing an inductance of an electrical pathway through which at least one of the plurality of flash lamps 182, 183, 185 and 187 is discharged. More particularly, to achieve this increase in inductance, block 910 directs the processor circuit 110 to apply a gate voltage, at the boost time specified by the pulse intervention look-up table 298, to the thyristor 832 of the power boost circuit 830 of the power control circuit 800 corresponding to the flash lamp(s) specified by the contents of the pulse intervention look-up table 298. This increase in inductance is described in greater detail in US 2007/0069161. If desired, a supplemental capacitor (not shown) may also be provided as disclosed in US 2007/0069161, so that the supplemental capacitor immediately begins discharging through the affected flash lamp when the gate voltage is applied to the thyristor 832.

Following pulse modification at block 910, the pulse feedback control routine 290 is then ended. Alternatively, if in a given embodiment, one act of intervention at block 910 can be followed with a second act of intervention upon a subsequent execution of block 910, the processor circuit may be directed to block 912 to continue processing.

In this embodiment, if at block 908 the parameter stored in the present process completion register 296 did not deviate from the expected value stored in the expected process completion store 294 by more than the threshold difference, block 912 directs the processor circuit 110 to determine whether the generation of the irradiance pulse 506 has been completed. In the present embodiment, this is achieved by determining whether more than 4 ms have elapsed since commencement of the generation of the pulse 506, although alternatively, other criteria may be applied to determine completion of the generation of the irradiance pulse 506. If the generation of the irradiance pulse 506 has not yet been completed, the processor circuit 110 is directed back to block 908 to continue monitoring the parameter indicative of the presently completed amount of the desired thermal activation process, for possible deviation from its expected value as discussed above. Upon completion of the generation of the irradiance pulse 506, the pulse feedback control routine 290 is then ended.

In accordance with another similar embodiment of the invention, such pulse modification may be provided for every irradiance pulse, rather than merely for those whose effects on the workpiece deviate from the expected effects by more than a threshold difference. For example, in an illustrative alternative embodiment, the capacitor banks of the flash lamps are intentionally overcharged, so that block 910 always directs the processor circuit 110 to control the irradiance pulse generating system 180 to shorten the duration of the subsequent sustaining portion 504, by extinguishing the irradiance flashes produced by all of the flash lamps. Referring back to FIG. 3, therefore, in this illustrative alternative embodiment, the resulting irradiance pulse always has a steeply sloped trailing edge similar to the trailing edge 305 of the irradiance pulse 300. This illustrative alternative embodiment tends to enhance the rapidity of the cooling of the target surface area of the workpiece following exposure to the sustaining portion of the irradiance pulse, ensures a more consistent overall thermal cycle, and may also provide further enhanced control over the actual process results that are achieved. In this illustrative alternative embodiment, the notion of a threshold is omitted and the pulse intervention look-up table 298 is automatically used at block 910 to determine the time at which the flash lamps are to be extinguished, based upon the comparison of expected to actual process completion values as discussed above.

Alternatively, in yet another illustrative embodiment, the irradiance pulse is always prematurely terminated by extinguishing the flash lamps to provide a steeply sloped trailing edge similar to that shown at 305 in FIG. 3, but feedback control is omitted. The irradiance pulse may be prematurely extinguished at an adjustable time specified by a user through software control, or at a time dictated by the main RTP routine in response to other more general parameters of the thermal cycle specified by the user, or at a default time, for example.

Alternatively, or in addition to, such real-time feedback control as described above, the irradiance pulse 506 and the resulting temperature-time profile 608 may also be easily modified in other ways through software control alone, without the necessity of physically removing and replacing hardware components. For example, as the irradiance pulse components 508, 510 and 512 may be generated by the processor circuit applying gate voltages to respective thyristors 836 of the relevant individual electrical power supply systems 189, 191, 193 and 195, the main RTP routine 221 or the pulse feedback control routine 290 may be modified to enable a user to easily change the relative timing of the irradiance pulse components. Likewise, as the processor circuit 110 can adjust the magnitudes of the individual pulse components 508, 510 and 512 by controlling the power supply unit 802 of each individual electrical power supply system 189, 191, 193 or 195 to charge the relevant capacitor bank 828 to a different adjustable DC voltage, the main RTP routine or the pulse feedback control routine 290 may be modified to allow the user to easily adjust the relative magnitudes of these components. In addition, the illustrative examples of pulse modification approaches described herein are also easily software-adjustable, such as the application by the processor circuit 110 of gate voltages to a thyristor 822 to prematurely extinguish a pulse or to a thyristor 832 to extend or boost a pulse. Accordingly, these pulse modification approaches may be easily adjusted by a user, either globally or to selectively control individual pulse components produced by individual flash lamps, through software rather than requiring hardware redesigns. Such modifications to the relative timing, magnitudes and shapes of the irradiance pulse components may be made in embodiments that lack real-time feedback control during the irradiance pulse as described above, as well as in embodiments that provide such feedback control. Although four high-power flash lamps have been described for illustrative purposes, alternatively, the use of a much larger number of lower-power flash lamps may facilitate finer control of the overall shape of the irradiance pulse 506.

Such techniques may be combined in other embodiments. For example, although the embodiments discussed above tended to use similar circuitry for each of the four flash lamps 182, 183, 185 and 187, alternatively, different power control circuit components may be substituted to further vary pulse shapes. Thus, the power control circuits for different flash lamps may have different inductors, capacitors, resistors and other components from those discussed above, for example. Such varied power control circuits may be the same for all lamps, or alternatively, each flash lamp may use a different unique power control circuit. Similarly, different adjustable charging voltages and pulse initiation times may be combined, either in embodiments having similar or different power control circuitry to that discussed above, and whether such circuitry is the same for all flash lamps or unique for each lamp. Embodiments combining two or more of these approaches, such as an embodiment having different power supply circuitry for different lamps, different charging voltages, different relative discharge times and individual pulse modification capability for each lamp, for example, may yield finer pulse-shaping control. Thus, a resulting irradiance pulse may be produced which more closely approximates the exemplary irradiance pulse 300 shown in FIG. 3. As a result, in such embodiments, the sustaining portion of the pulse may maintain the temperature of the target surface area of the workpiece within a smaller desired range from the desired temperature than that shown at 604 in FIG. 6. For example, in some such embodiments, the desired range may be within about $1 \times 10^{1 \circ}$ C. from the desired temperature 602. In other such embodiments, the desired range may be within about 3° C. from the desired temperature.

As a further alternative, although a plurality of temporally staggered and overlapping irradiance pulse components 508, 510 and 512 were combined to generate the irradiance pulse 506, alternatively, a plurality of simultaneously initiated electrical pulse components may be employed to produce a plurality of corresponding simultaneously initiated irradiance pulse components, and the electrical pulse components may be modified by appropriate current reduction or boost techniques such as those described herein and in US 2007/0069161 to cause the resulting overall combined irradiance pulse to conform to a desired novel pulse shape, such as that shown at 300 in FIG. 3, or that shown at 506 in FIG. 5, for example.

Alternatively, a single irradiance source may be substituted for the plurality of flash lamps. For example, referring to FIG. 10, a heat-treating apparatus according to a third embodiment of the invention is shown generally at 1000. In contrast with the embodiments described above in which the target surface area of the workpiece 106 was the entire device side surface 122, in this embodiment the target surface area of the workpiece includes an area segment 1002 of the device side 122 of the semiconductor wafer 120. In the present embodiment, the irradiance pulse generating system includes a scanning laser 1004, which is substituted for the plurality of flash lamps shown in FIG. 1. In this embodiment, the scanning laser 1004 is configured to generate a laser beam 1006 having an asymmetric spatial profile. The processor circuit 110 (not shown in FIG. 10) is configured to generate the irradiance pulse by controlling the scanning laser 1004 to scan the laser beam 1006 having the asymmetric spatial profile across the area segment 1002 within less than the thermal conduction time of the workpiece 106.

Figure 10:
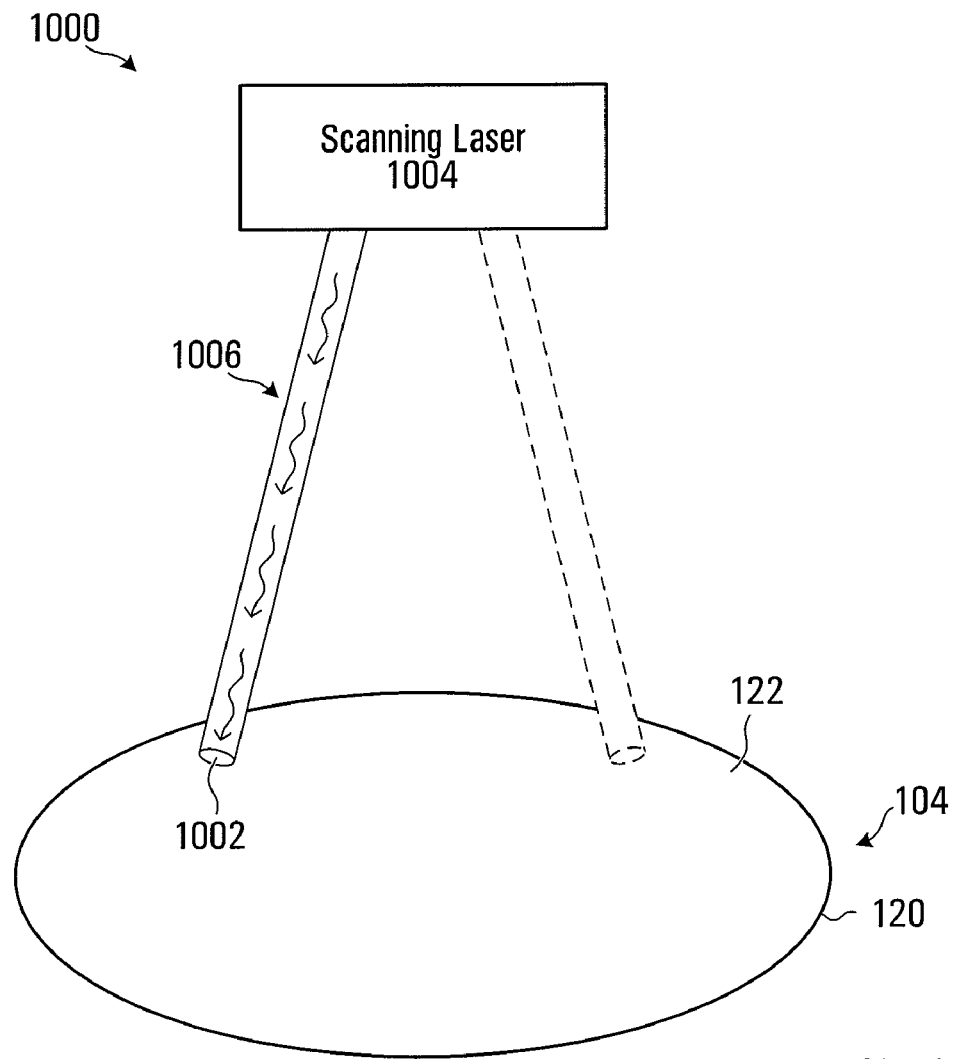
FIG. 10 is a representative drawing of a rapid thermal processing (RTP) system according to a third embodiment of the invention.

Referring to FIGS. 3 and 10, in this embodiment, the processor circuit 110 is configured to control the irradiance pulse generating system (in this embodiment the scanning laser 1004) to generate the initial heating portion 302 and the subsequent sustaining portion 304 of the irradiance pulse 300 incident on the target surface of the workpiece 106, which in this embodiment is the area segment 1002. Also as in the previously described embodiments, a combined duration of the initial heating portion 302 and the subsequent sustaining portion 304 is less than a thermal conduction time of the workpiece. The initial heating portion 302 heats the target surface area, i.e. the area segment 1002, to a desired temperature, and the subsequent sustaining portion 304 maintains the target surface area within a desired range from the desired temperature.

More particularly, in this embodiment the scanning laser 1004 scans the laser beam 1006 across the device side 122 in progressive line scans, so that the laser beam sweeps across the area segment 1002 in less than the thermal conduction time of the workpiece, and scans across each adjacent area segment on the same scanning line as the area segment 1002 in less than the thermal conduction time of the workpiece, but the scanning across an entire scanning line typically takes longer than the thermal conduction time of the workpiece. The laser beam 1006 is scanned across successive lines on the device side 122 until each individual area segment on the device side has been scanned by the laser beam 1006 in less than the thermal conduction time of the workpiece. Thus, the laser beam 1006 heats each such area segment rapidly, while the bulk of the workpiece beneath the area segment remains at a relatively cold intermediate temperature, thereby acting as a heat sink to facilitate rapid cooling of the area segment after the laser beam 1006 has scanned over it. If desired, such laser scanning may be combined with pre-heating as described above in connection with other embodiments.

Figure 11:
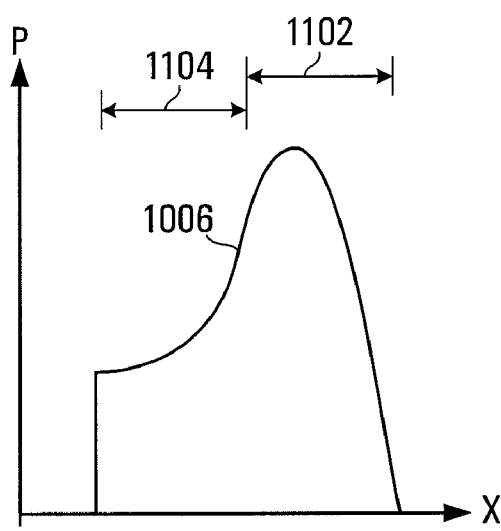
FIG. 11 is a graphical representation of a spatial profile of a laser beam for generating an irradiance pulse according to the third embodiment of the invention.

Referring to FIGS. 3, 10 and 11, in this embodiment the processor circuit 110 is configured to control the scanning laser 1004 to generate the initial heating portion 302 by scanning a first spatial portion 1102 of the laser beam 1006 across the area segment 1002, and to generate the subsequent sustaining portion 304 by scanning a second spatial portion 1104 of the laser beam 1006 across the area segment 1002, the first spatial portion 1102 and the second spatial portion 1104 being asymmetric. More particularly, in this embodiment the laser beam 1006 as shown in FIG. 11 is scanned from left to right across each successive line of the device side 122, so that a leading edge of the first spatial portion 1102 is the first part of the laser beam to begin to scan across any given target surface area such as the area segment 1002, and the trailing edge of the second spatial portion 1104 is the last part of the laser beam to finish scanning over the target surface area. It will be appreciated that the spatial profile of the laser beam 1006 shown in FIG. 11 is effectively a mirror image of the temporal profile of the irradiance pulse 300 shown in FIG. 3, and that rapidly scanning the laser beam 1006 from left to right across the area segment 1002 within less than the thermal conduction time of the workpiece will effectively expose that area segment to an irradiance pulse having a temporal shape as shown at 300 in FIG. 3.

The spatial profile of the laser beam 1006 shown in FIG. 11 may be achieved in any suitable manner. For example, the lens and other optical components described in U.S. Pat. No. 7,005,601 may be modified to produce a laser beam having the spatial profile shown in FIG. 11. Such modifications are expected to be well within the skill of a person ordinarily skilled in the art of lens design when presented with the teachings of the present specification.

If desired, the embodiment shown in FIGS. 10 and 11 may be further modified to incorporate real-time feedback control of the irradiance pulse resulting from the scanning of the laser beam 1006 over a given target surface area. For example, a parameter indicative of a presently completed amount of the desired thermal process during the irradiance pulse may be monitored as described earlier herein. Instead of the pulse modification techniques discussed above in connection with flash lamp systems, the processor circuit 110 may be configured to control the scanning laser 1004 to modify the irradiance pulse by changing the total laser power or by reducing power supplied by the laser beam to the area segment 1002 as it scans across it, or conversely, by increasing power supplied by the laser beam to the area segment 1002.

Alternatively, other ways of generating irradiance pulses according to illustrative embodiments of the invention may be substituted for those described above. For example, rather than using a single irradiance source or a small number of irradiance sources, a large number of irradiance sources may be employed. As an illustrative example, a large number of flash lamps may be employed, discharging a larger number of the flash lamps to generate the initial heating portion and smaller numbers of flash lamps in succession or in successive groups to generate and sustain the sustaining portion. Alternatively, commercially available pulse-forming networks may be configured to power a single source or multiple sources to generate irradiance pulses according to illustrative embodiments of the invention.

Referring back to FIGS. 3 and 5, other illustrative embodiments may involve irradiance pulses that differ from both the ideal irradiance pulse 300 shown in FIG. 3 and the illustrative irradiance pulse 506 shown in FIG. 5. For example, in an illustrative alternative embodiment, the subsequent sustaining portion may be considerably longer in duration. In such an embodiment, due to the temporal elongation of the sustaining portion, and the fact that the magnitude of the ideal sustaining portion trails off with time, the average magnitude of the sustaining portion may be less than half of the peak magnitude of the initial heating portion of the pulse. As a result, the Full Width at Half-Maximum may primarily represent the duration of the initial heating portion and may exclude most of the sustaining portion which falls below Half-Maximum, so that the Full Width at One-Quarter Maximum (FWQM) becomes a more meaningful indicator of overall pulse duration. Unlike the irradiance pulse 506 shown in FIG. 5, the FWQM of the irradiance pulse in other embodiments may be more than half of the thermal conduction time of the workpiece. In one such illustrative embodiment, the Full Width at One-Quarter Maximum (FWQM) of the entire irradiance pulse may be on the order of about $1 \times 10^{-2}$ seconds (10 ms), in contrast to the FWQM of about 3 ms for the irradiance pulse 506. The Full Width at One-Tenth Maximum for such an alternative pulse may even exceed 10 ms, although for many applications it is preferable to avoid sustaining the temperature of the target area on the surface at or near the desired process temperature for times equal to or longer than the thermal conduction time of the workpiece, to avoid undesirable amounts of diffusion or other undesirable effects. The Full Width at Half-Maximum (FWHM) of such an irradiance pulse may be about 2 to 3 ms, for example.

More generally, while specific embodiments of the invention have been described and illustrated, such embodiments should be considered illustrative of the invention only and not as limiting the invention as construed in accordance with the accompanying claims.

What is claimed is:

1. A method of heat-treating a workpiece, the method comprising, under the control of a processor circuit:
   generating an initial heating portion and a subsequent sustaining portion of an irradiance pulse incident on a target surface area of the workpiece;
   wherein a combined duration of the initial heating portion and the subsequent sustaining portion is less than a thermal conduction time of the workpiece;
   monitoring at least one parameter indicative of a presently completed amount of a desired thermal process during the irradiance pulse; and
   modifying the irradiance pulse in response to deviation of the at least one parameter from an expected value.

2. The method of claim 1 wherein the workpiece comprises a semiconductor wafer.

3. The method of claim 2 wherein modifying comprises shortening a duration of the subsequent sustaining portion if the at least one parameter exceeds the expected value by more than a threshold difference.

4. The method of claim 3 wherein the target surface area comprises a device side of the semiconductor wafer, wherein generating comprises generating the irradiance pulse using a plurality of flash lamps, and wherein shortening the duration of the irradiance pulse comprises prematurely extinguishing an irradiance flash produced by at least one of the plurality of flash lamps.

5. The method of claim 2 wherein the target surface area comprises an area segment of a device side of the semiconductor wafer, wherein generating the irradiance pulse comprises scanning a laser beam having an asymmetric spatial profile across the area segment within less than the thermal conduction time of the workpiece, and wherein modifying the irradiance pulse comprises reducing power supplied by the laser beam to the area segment.

6. The method of claim 2 wherein modifying comprises lengthening a duration of the subsequent sustaining portion if the expected value exceeds the at least one parameter by more than a threshold difference.

7. The method of claim 6 wherein the target surface area comprises a device side of the semiconductor wafer, wherein generating comprises generating the irradiance pulse using a plurality of flash lamps, and wherein lengthening the duration of the subsequent sustaining portion comprises increasing an inductance of an electrical pathway through which at least one of the plurality of flash lamps is discharged.

8. The method of claim 2 wherein the target surface area comprises an area segment of a device side of the semiconductor wafer, wherein generating the irradiance pulse comprises scanning a laser beam having an asymmetric spatial profile across the area segment within less than the thermal conduction time of the workpiece, and wherein modifying the irradiance pulse comprises increasing power supplied by the laser beam to the area segment.

9. An apparatus for heat-treating a workpiece, the apparatus comprising:
   an irradiance pulse generating system;
   a measurement system;
   a processor circuit configured to control the irradiance pulse generating system to generate an initial heating portion and a subsequent sustaining portion of an irradiance pulse incident on a target surface area of the workpiece;
   wherein a combined duration of the initial heating portion and the subsequent sustaining portion is less than a thermal conduction time of the workpiece;
   wherein the processor circuit is configured to:
      co-operate with the measurement system to monitor at least one parameter indicative of a presently completed amount of a desired thermal process during the irradiance pulse; and
      control the irradiance pulse generating system to modify the irradiance pulse in response to deviation of the at least one parameter from an expected value.

10. The apparatus of claim 9 wherein the workpiece comprises a semiconductor wafer.

11. The apparatus of claim 10 wherein the processor circuit is configured to control the irradiance pulse generating system to modify the irradiance pulse by shortening a duration of the subsequent sustaining portion if the at least one parameter exceeds the expected value by more than a threshold difference.

12. The apparatus of claim 11 wherein the target surface area comprises a device side of the semiconductor wafer, wherein the irradiance pulse generating system comprises a plurality of flash lamps, and wherein the processor circuit is configured to control the irradiance pulse generating system to shorten the duration of the irradiance pulse by prematurely extinguishing an irradiance flash produced by at least one of the plurality of flash lamps.

13. The apparatus of claim 10 wherein the target surface area comprises an area segment of a device side of the semiconductor wafer, wherein the irradiance pulse generating system comprises a scanning laser configured to generate a laser beam having an asymmetric spatial profile, wherein the processor circuit is configured to generate the irradiance pulse by controlling the scanning laser to scan the laser beam having the asymmetric spatial profile across the area segment within less than the thermal conduction time of the workpiece, and wherein the processor circuit is configured to control the scanning laser to modify the irradiance pulse by reducing power supplied by the laser beam to the area segment.

14. The apparatus of claim 10 wherein processor circuit is configured to control the irradiance pulse generating system to modify the irradiance pulse by lengthening a duration of the subsequent sustaining portion if the expected value exceeds the at least one parameter by more than a threshold difference.

15. The apparatus of claim 14 wherein the target surface area comprises a device side of the semiconductor wafer, wherein the irradiance pulse generating system comprises a plurality of flash lamps, and wherein the processor circuit is configured to control the irradiance pulse generating system to lengthen the duration of the subsequent sustaining portion by increasing an inductance of an electrical pathway through which at least one of the plurality of flash lamps is discharged.

16. The apparatus of claim 10 wherein the target surface area comprises an area segment of a device side of the semiconductor wafer, wherein the irradiance pulse generating system comprises a scanning laser configured to generate a laser beam having an asymmetric spatial profile, wherein the processor circuit is configured to generate the irradiance pulse by controlling the scanning laser to scan the laser beam having the asymmetric spatial profile across the area segment within less than the thermal conduction time of the workpiece, and wherein the processor circuit is configured to control the scanning laser to modify the irradiance pulse by increasing power supplied by the laser beam to the area segment.

17. An apparatus for heat-treating a workpiece, the apparatus comprising:
- means for generating an initial heating portion of an irradiance pulse incident on a target surface area of the workpiece;
- means for generating a subsequent sustaining portion of an irradiance pulse incident on a target surface area of the workpiece;
- wherein a combined duration of the initial heating portion and the subsequent sustaining portion is less than a thermal conduction time of the workpiece;
- means for monitoring at least one parameter indicative of a presently completed amount of a desired thermal process during the irradiance pulse; and
- means for modifying the irradiance pulse in response to deviation of the at least one parameter from an expected value.

* * * * *